(12) United States Patent
Seomoon et al.

(10) Patent No.: US 11,353,981 B2
(45) Date of Patent: *Jun. 7, 2022

(54) DISPLAY DEVICE IN WHICH AN IMAGE IS DISPLAYED ON A SIDE SURFACE

(71) Applicant: Samsung Display Co., Ltd., Yongin-si (KR)

(72) Inventors: Hee Seomoon, Hwaseong-si (KR); Won Ki Hong, Suwon-si (KR); Sung Kook Park, Suwon-si (KR); So Hee Park, Cheonan-si (KR); Tae Hee Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/242,122

(22) Filed: Apr. 27, 2021

(65) Prior Publication Data

US 2021/0271366 A1    Sep. 2, 2021

Related U.S. Application Data

(63) Continuation of application No. 16/414,712, filed on May 16, 2019, now Pat. No. 11,023,064.

(30) Foreign Application Priority Data

Aug. 17, 2018    (KR) .................. 10-2018-0096108

(51) Int. Cl.
*G06F 3/041*    (2006.01)
*H05K 1/14*    (2006.01)
(Continued)

(52) U.S. Cl.
CPC ........ *G06F 3/04142* (2019.05); *G06F 3/0481* (2013.01); *G06F 3/0488* (2013.01);
(Continued)

(58) Field of Classification Search
CPC ............ G06F 3/04142; G06F 3/04883; G06F 3/0481; G06F 3/0488; G06F 3/04817;
(Continued)

(56) References Cited

U.S. PATENT DOCUMENTS 7,538,760 B2    5/2009 Hotelling et al.
8,654,524 B2    2/2014 Pance et al.
(Continued)

FOREIGN PATENT DOCUMENTS

KR    10-2019-0132586    11/2019

OTHER PUBLICATIONS

Non-Final Office Action dated Jul. 31, 2020, issued to U.S. Appl. No. 16/414,712.

(Continued)

*Primary Examiner* — Vijay Shankar
(74) *Attorney, Agent, or Firm* — H.C. Park & Associates, PLC

(57) ABSTRACT

A display device including a first pressure sensor disposed under a display panel that includes an upper surface, a first upper curved portion extended from a first edge of the upper surface, and a first side surface extended from the first upper curved portion. The first pressure sensor is disposed in the first upper curved portion.

20 Claims, 35 Drawing Sheets

(51) Int. Cl.
*H05K 1/18* (2006.01)
*G06F 3/04817* (2022.01)
*H01L 27/32* (2006.01)
*G06F 3/04883* (2022.01)
*G06F 3/0481* (2022.01)
*G06F 3/0488* (2022.01)

(52) U.S. Cl.
CPC ...... *G06F 3/04817* (2013.01); *G06F 3/04883* (2013.01); *H01L 27/323* (2013.01); *H05K 1/147* (2013.01); *H05K 1/189* (2013.01); *H05K 2201/10128* (2013.01); *H05K 2201/10151* (2013.01)

(58) Field of Classification Search
CPC . G06F 2203/04103; G06F 2203/04105; G06F 3/0412; G06F 3/0414; G06F 3/044; G06F 2203/04102; H05K 1/147; H05K 1/189; H05K 2201/10128; H05K 2201/10151; H01L 27/323; H01L 27/3225
See application file for complete search history.

(56) References Cited

U.S. PATENT DOCUMENTS

| | | | |
|---|---|---|---|
| 8,686,952 B2 | 4/2014 | Burrough et al. | |
| 8,787,006 B2 | 7/2014 | Golko et al. | |
| 8,816,972 B2* | 8/2014 | Solomon | G09G 3/035 345/173 |
| 9,513,668 B2 | 12/2016 | Shin et al. | |
| 9,591,295 B2* | 3/2017 | Lockhart | G06F 3/005 |
| 9,778,803 B2 | 10/2017 | Sato | |
| 10,324,557 B2 | 6/2019 | Lu et al. | |
| 10,452,106 B2* | 10/2019 | Cho | G06F 1/1647 |
| 10,936,136 B2* | 3/2021 | Myers | H04M 1/0268 |
| 2014/0028575 A1 | 1/2014 | Parivar et al. | |
| 2014/0085213 A1 | 3/2014 | Huppi et al. | |
| 2014/0091857 A1 | 4/2014 | Bernstein | |
| 2014/0092064 A1 | 4/2014 | Bernstein et al. | |
| 2014/0293145 A1 | 10/2014 | Jones et al. | |
| 2015/0379915 A1* | 12/2015 | Lin | G09G 3/2007 345/694 |
| 2018/0210598 A1 | 7/2018 | Lu et al. | |
| 2019/0302949 A1 | 10/2019 | Ling et al. | |
| 2019/0353540 A1 | 11/2019 | Hong et al. | |
| 2020/0026422 A1 | 1/2020 | Seomoon et al. | |
| 2020/0042125 A1 | 2/2020 | Lee et al. | |
| 2020/0042132 A1 | 2/2020 | Kong et al. | |

OTHER PUBLICATIONS

Notice of Allowance dated Jan. 27, 2021, issued to U.S. Appl. No. 16/414,712.

* cited by examiner

FIG. 11
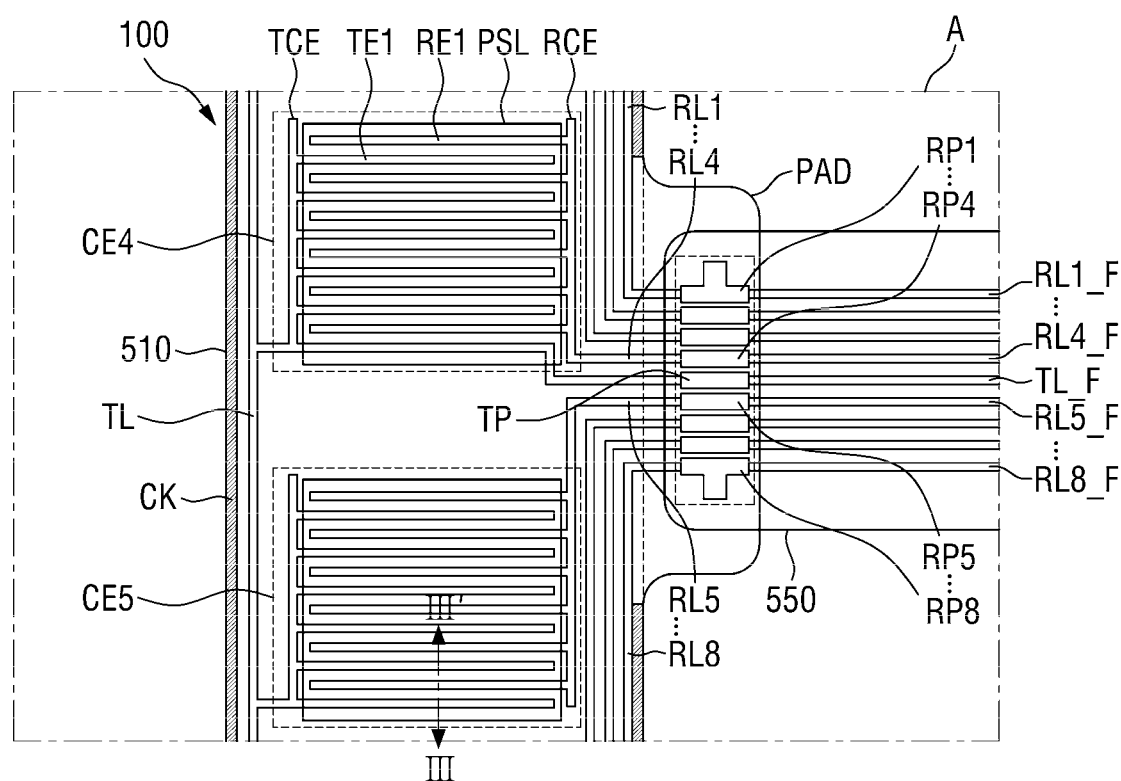
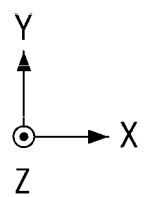

FIG. 12
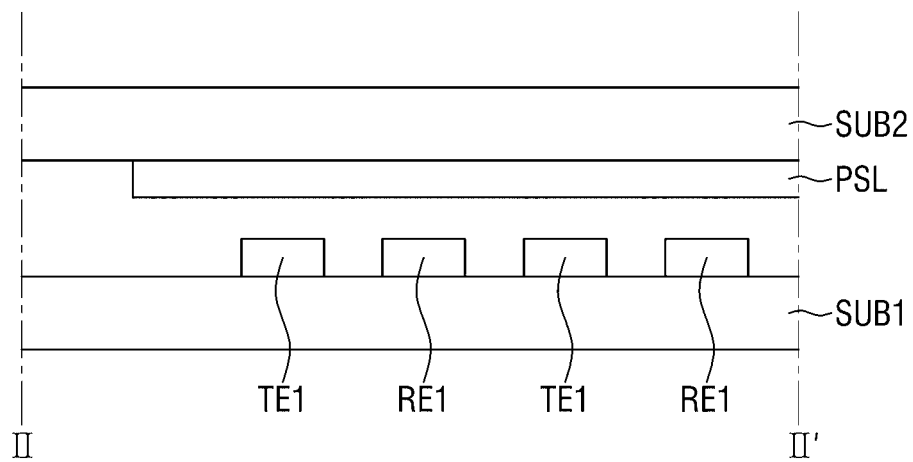
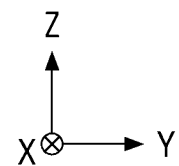

`US 11,353,981 B2`

DISPLAY DEVICE IN WHICH AN IMAGE IS DISPLAYED ON A SIDE SURFACE

CROSS REFERENCE TO RELATED APPLICATION

This application is a continuation of U.S. patent application Ser. No. 16/414,712, filed on May 16, 2019, which claims priority from and the benefit of Korean Patent Application No. 10-2018-0096108 filed on Aug. 17, 2018, which is hereby incorporated by reference for all purposes as if fully set forth herein.

BACKGROUND

Field

Exemplary embodiments of the invention relate generally to a display device.

Discussion of the Background

Electronic devices that represent images to a user, such as a smart phone, a tablet PC, a digital camera, a laptop computer, a navigation device, and a smart TV, include a display device for displaying images. Such a display device includes a display panel for generating and displaying an image and various input means.

Recently, a touch panel that recognizes a touch input has been widely employed for display devices of smart phones and tablet PCs. By virtue of its convenience, a touch panel is increasingly replacing existing physical input means, such as a keypad. Moreover, research is currently being conducted to achieve various input means by disposing a pressure sensor on a display device.

The above information disclosed in this Background section is only for understanding of the background of the inventive concepts, and, therefore, it may contain information that does not constitute prior art.

SUMMARY

Exemplary embodiments of the present invention provide a display device in which images are displayed on the side surfaces and the lower surface thereof and in which pressure sensors are disposed on the side surfaces or the lower surface thereof.

Additional features of the inventive concepts will be set forth in the description which follows, and in part will be apparent from the description, or may be learned by practice of the inventive concepts.

An exemplary embodiment of the present invention provides a display device including a display panel having an upper surface, a first upper curved portion extended from a first edge of the upper surface, and a first side surface extended from the first upper curved portion; and a first pressure sensor disposed under the display panel. The first pressure sensor is disposed in the first upper curved portion.

Another exemplary embodiment of the present invention provides a display device including a display panel including an upper surface, a first upper curved portion extended from a first edge of the upper surface, and a first side surface extended from the first upper curved portion; and a first pressure sensor disposed under the display panel. The first pressure sensor is disposed on the first side surface.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 11 is a plan view of area A shown in FIG. 8.

FIG. 12 is a cross-sectional view taken along line III-III' of FIG. 11.

DETAILED DESCRIPTION

Figure 1:
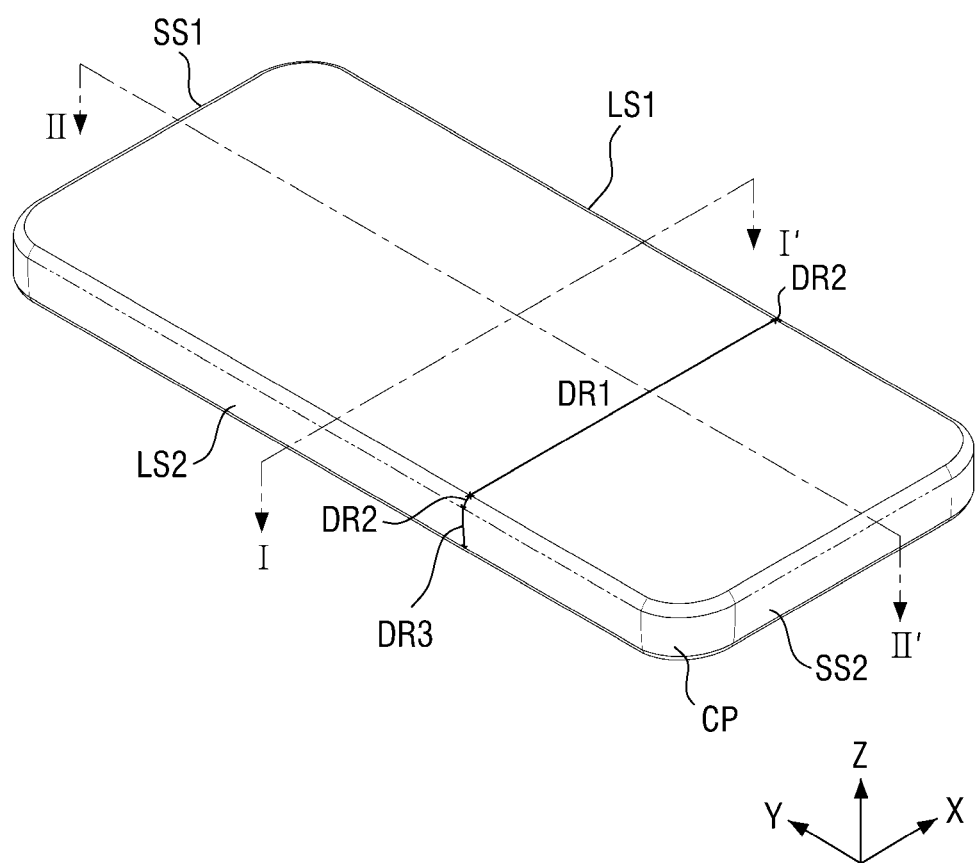
FIG. 1 is a perspective view of a display device according to an exemplary embodiment of the present invention.

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments of the present invention will be described with reference to the accompanying drawings.

Figure 2:
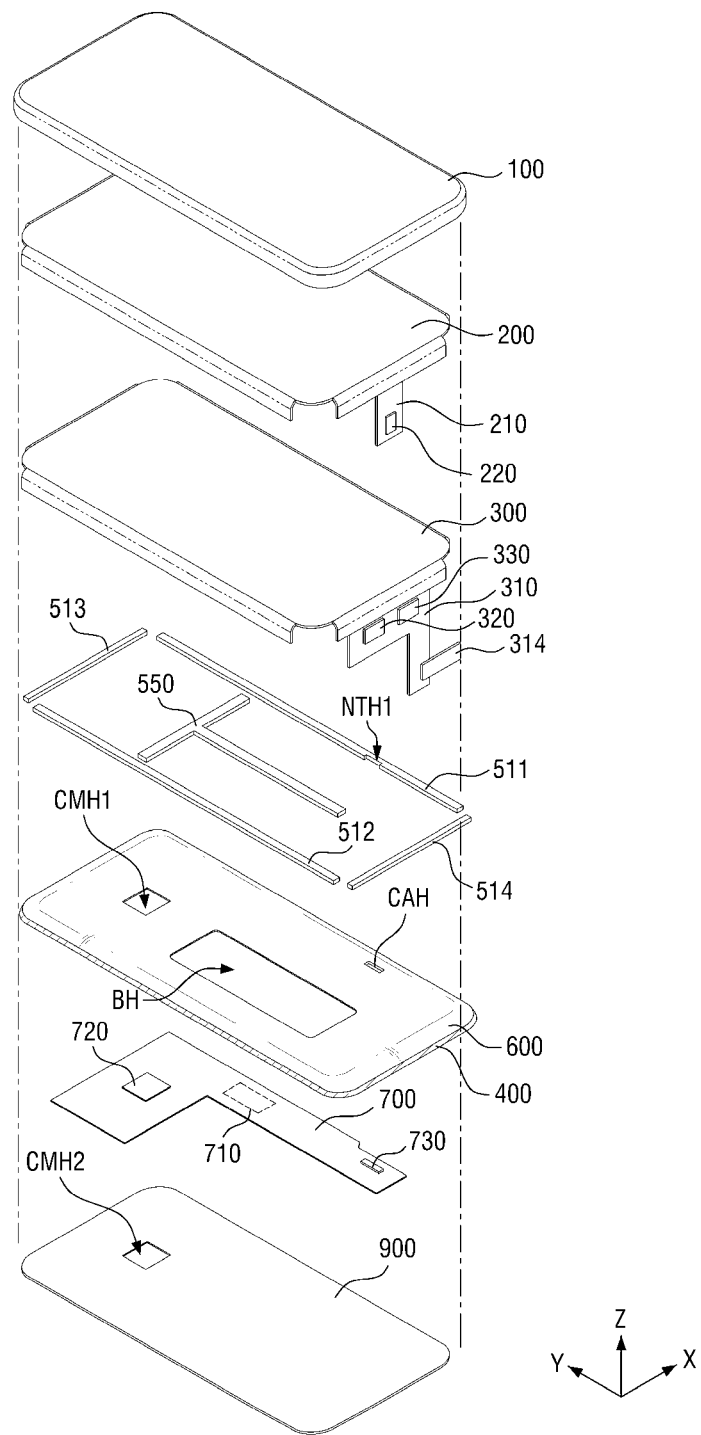
FIG. 2 is an exploded perspective view of a display device according to an exemplary embodiment of the present invention.

FIG. 1 is a perspective view of a display device according to an exemplary embodiment of the present invention. FIG. 2 is an exploded, perspective view of a display device according to an exemplary embodiment of the present invention.

Referring to FIGS. 1 and 2, a display device 10 according to an exemplary embodiment of the present invention includes a cover window 100, a touch sensing device 200, a touch circuit board 210, a touch driver 220, a display panel 300, a display circuit board 310, a display driver 320, a pressure sensing unit 330, a first pressure sensor 511, a second pressure sensor 512, a pressure sensing circuit board 550, a middle frame 600, a main circuit board 700, and a bottom cover 900.

As used herein, the terms "above," "top" and "upper surface" refer to the side of the display panel 300 in the z-axis direction where the window 100 is disposed, whereas the terms "below," "bottom" and "lower surface" refer to the opposite side of the display panel 300 in the z-axis direction where the middle frame 600 is disposed. As used herein, the terms "left," "right," "upper" and "lower" indicate relative positions when the display panel 300 is viewed from the top. For example, the "left side" refers to the opposite direction indicated by the arrow of the x-axis, the "right side" refers to the direction indicated by the arrow of the x-axis, the "upper side" refers to the direction indicated by the arrow of the y-axis, and the "lower side" refers to the opposite direction indicated by the arrow of the y-axis.

The display device 10 may have a substantially rectangular shape when viewed from the top. The display device 10 may be a rectangle having corners at the right angle or rounded corners when viewed from the top. The display device 10 may have longer sides LS1 and LS2 and shorter sides SS1 and SS2. In describing the rectangular display device 10 or the display panel 300 or the like included therein, the longer side located on the first side in the plan view is referred to as a first longer side LS1, and the longer side located on the left side is referred to as a second longer side LS2, the shorter side located on the upper side is referred to as a first shorter side SS1, and the shorter side located on the lower side is referred to as a second shorter side SS2. The length of each of the longer sides LS1 and LS2 of the display device 10 may be, but is not limited to, being in a range of 1.5 times to 2.5 times the length of the shorter sides SS1 and SS2.

The display device 10 may include a first region DR1, second regions DR2, and third regions DR3 located on different planes, respectively. The first region DR1 is placed in a first plane. The second regions DR2 are connected to the first region DR1 and are bent or curved therefrom. The second regions DR2 may be placed in a second plane intersecting with the first plane at a predetermined angle or may have a curved surface. The second regions DR2 of the display device 10 are disposed in the vicinity of the first region DR1. The third regions DR3 are connected to the second regions DR2 and are bent or curved therefrom, respectively. The third regions DR3 may be located on a third plane intersecting with the second plane with a predetermined angle. The third plane may be, but is not limited to, a surface perpendicular to the first plane.

The second regions DR2 and the third regions DR3 may be disposed on the first and second shorter sides SS1 and SS2 and the first and second longer sides LS1 and LS2. For example, the second regions DR2 may be curved portions extended from the edges of the first region DR1 toward the first and second shorter sides SS1 and SS2 and the first and second longer sides LS1 and LS2. The third regions DR3 may be extended from the ends of the second regions DR2 to form the side surfaces of the first and second shorter sides SS1 and SS2 and the first and second longer sides LS1 and LS2 of the display device 10.

The first region DR1 of the display device 10 is used as the main display surface. However, the second regions DR2 and the third regions DR3, as well as the first region DR1, may also be used as the display area of the display device 10. In the following description, the first region DR1 of the display device 10 is a flat portion, which is the upper surface of the display device 10, while the second regions DR2 are curved portions and the third regions DR3 are vertical portions which are the side surfaces of the display device 10, for example. It is, however, to be understood that inventive concepts are not limited thereto. In addition, the display device 10 may further include corner portions CP of the second regions DR2 and the third regions DR3. The corner portions CP may be non-display areas of the second regions DR2 and the third regions DR3 spaced apart from each other. It is, however, to be understood that is the inventive concepts are not limited thereto. The second regions DR2 may be connected to the third regions DR3.

Figure 14A:
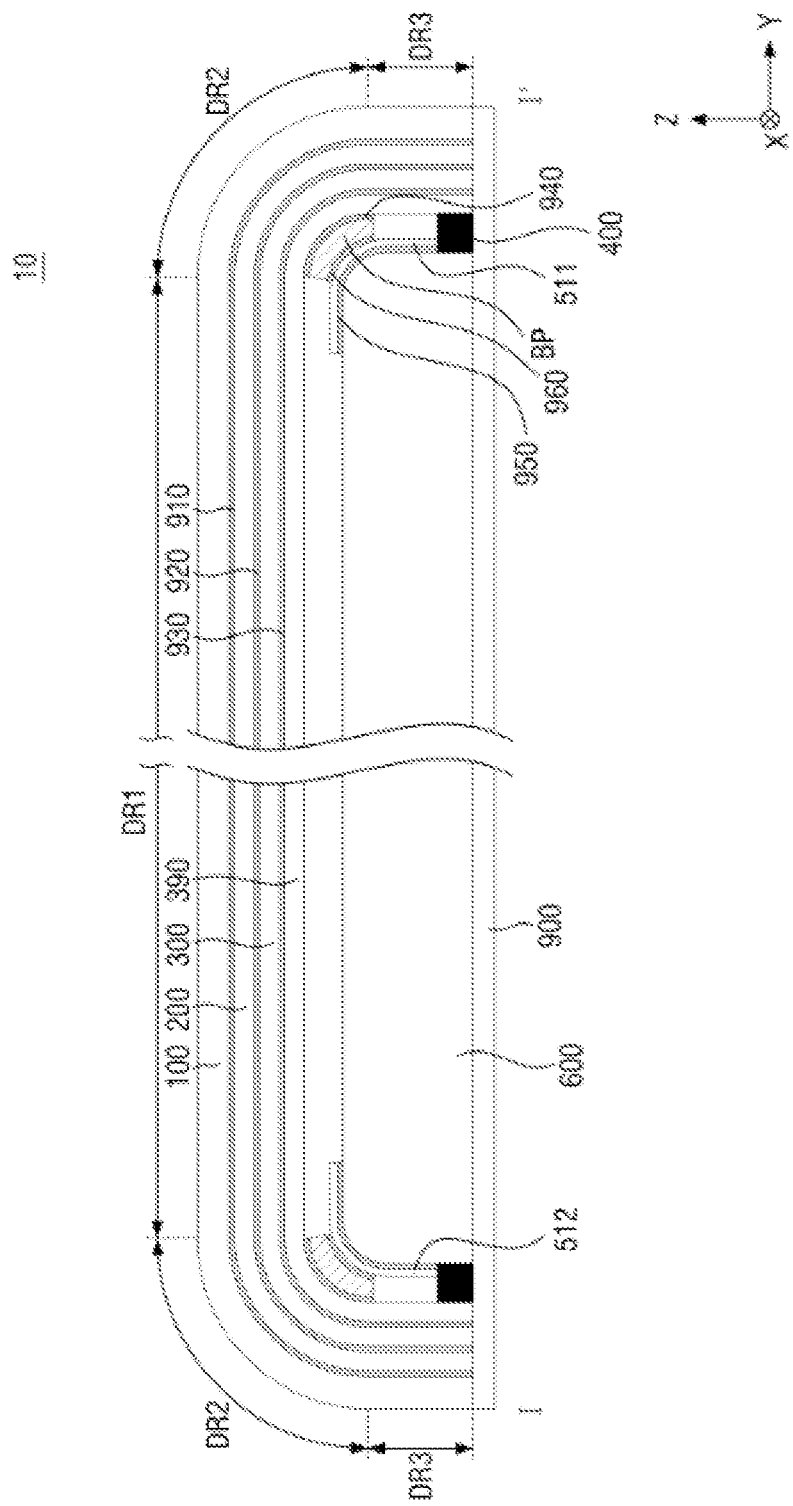
FIG. 14A, FIG. 14B, and FIG. 14C are cross-sectional views showing examples of display devices, taken along line I-I' of FIG. 1.
Figure 14B:
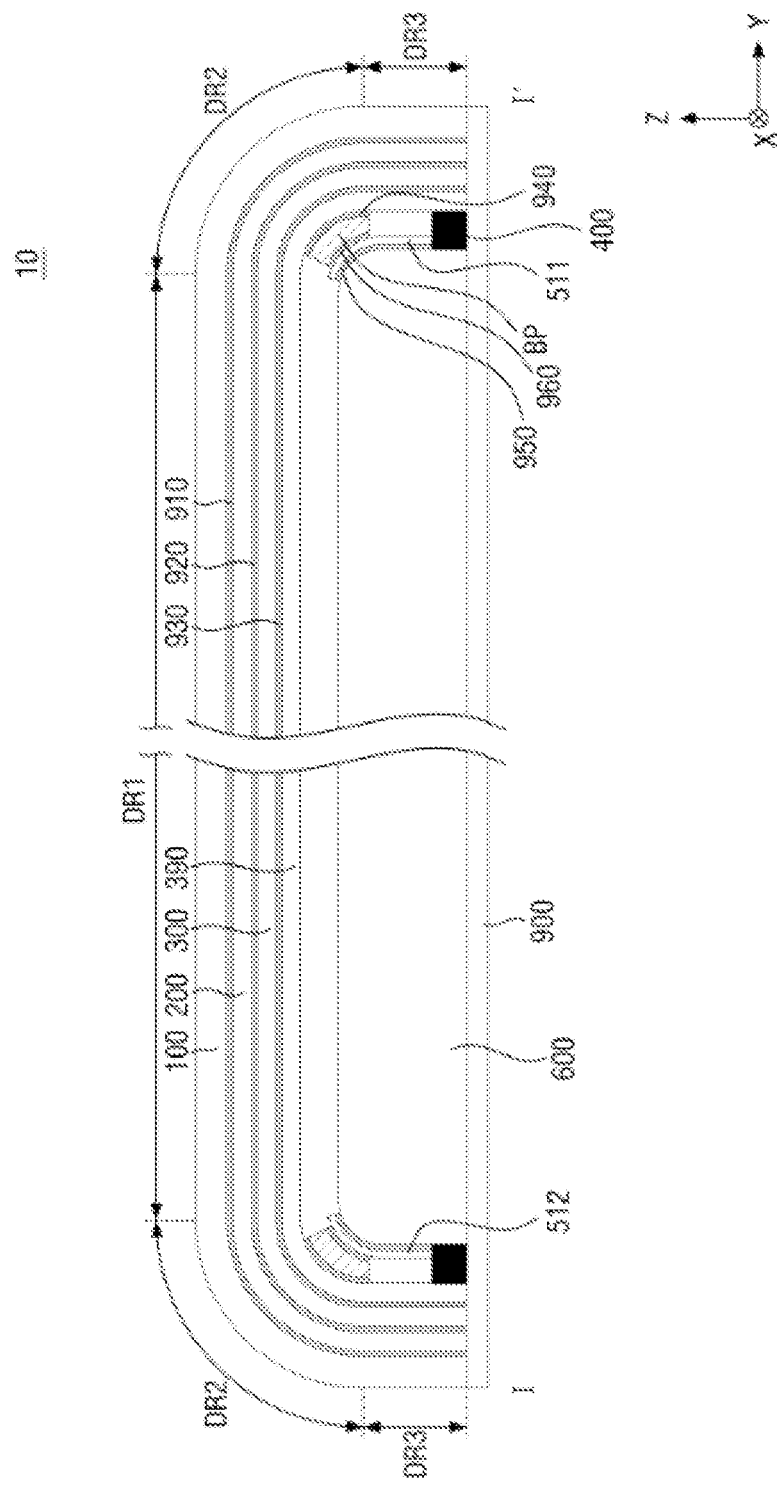
Figure 14C:
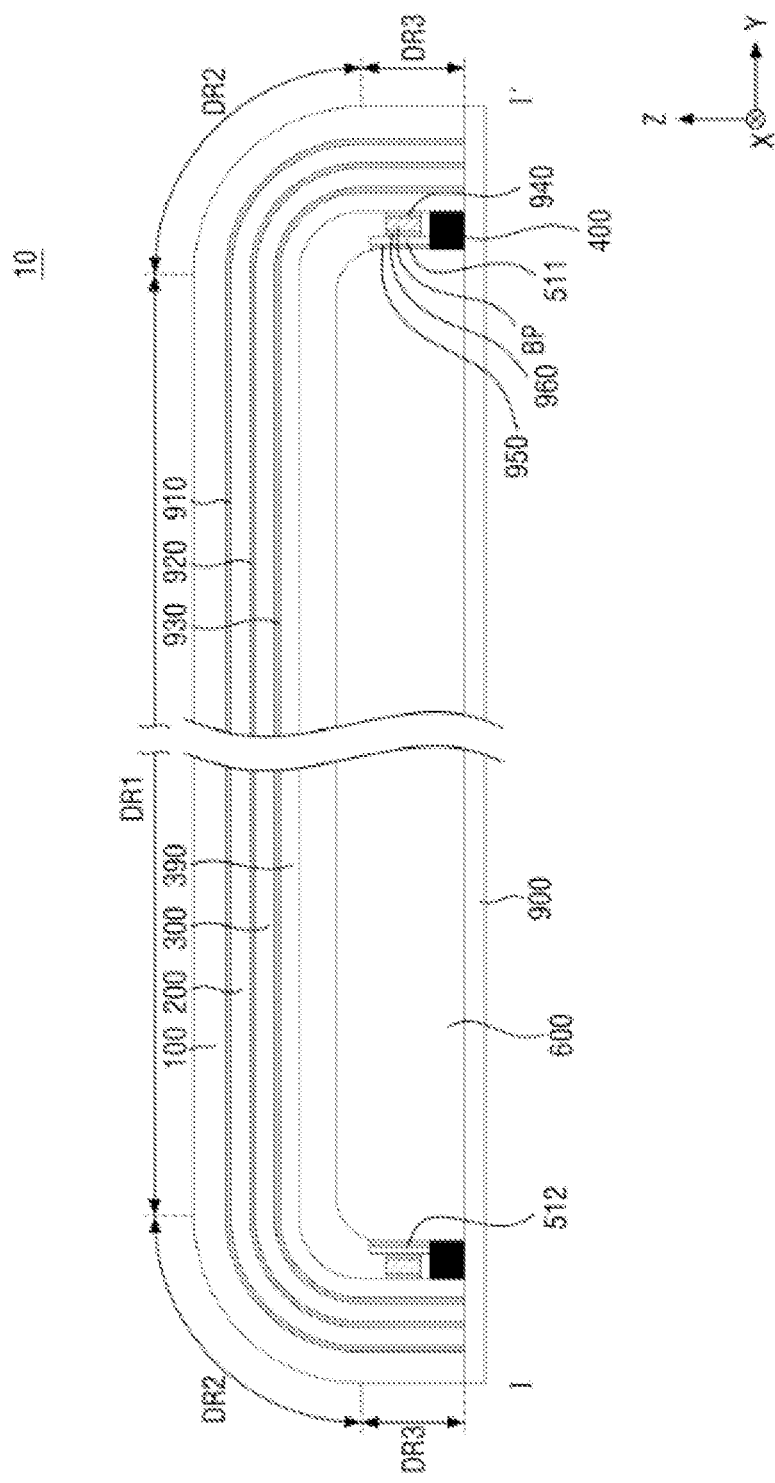

The cover window 100 may be disposed on the display panel 300 to cover the upper surface and side surfaces of the display panel 300. Thus, the cover window 100 can protect the upper surface and side surfaces of the display panel 300. The cover window 100 may be attached to the touch sensing device 200 through a first adhesive member 910, as shown in FIGS. 14A-14C. The first adhesive member 910 may be an optically cleared adhesive film (OCA) or an optically cleared resin (OCR).

The cover window 100 may be disposed such that it conforms to the display panel 300. The cover window 100 may be disposed in the first region DR1, the second regions DR2, and the third regions DR3. The cover window 100 may include a plurality of holes for exposing a front camera, a front speaker, an infrared sensor, an iris recognition sensor, an ultrasonic sensor, an illuminance sensor, etc. It is to be noted that the cover window 100 may include only some or none of the holes if some or all of the front camera, the front speaker, the infrared sensor, the iris recognition sensor, the ultrasonic sensor and the illuminance sensor are incorporated into the display panel 300.

The cover window 100 may be made of glass, sapphire, and/or plastic. The cover window 100 may be rigid or flexible.

The touch sensing device 200 may be disposed between the cover window 100 and the display panel 300. The touch sensing device 200 may be disposed in the first region DR1, the second regions DR2, and the third regions DR3. Therefore, a user's touch can be detected not only in the first region DR1 but also in the second regions DR2 and the third regions DR3.

The touch sensing device 200 may be attached to the lower surface of the cover window 100 through the first adhesive member 910. A polarizing film may be added on the touch sensing device 200 to avoid the visibility from decreasing due to reflection of external light. Then, the polarizing film may be attached to the lower surface of the cover window 100 through the first adhesive member 910.

The touch sensing device 200 is an element for sensing a user's touch position. The touch sensing device 200 may be implemented as a capacitive touch sensing device of a self-capacitance type or a mutual capacitance type. When the touch sensing device 200 is of a self-capacitance type, the touch sensing device 200 may include only the touch driving electrodes. On the other hand, when the touch sensing device 200 is of a mutual capacitance type, the touch sensing device 200 may include touch driving electrodes and touch sensing electrodes. In the following description, the mutual capacitive touch sensing device will be described as an example.

The touch sensing device 200 may be in the form of panel or film. The touch sensing device 200 may be attached to a thin-film encapsulation layer of the display panel 300 through the second adhesive member 920 as shown in FIGS. 14A-14C. The second adhesive member 920 may be a transparent adhesive film (OCA) or a transparent adhesive resin (OCR).

Alternatively, the touch sensing device 200 may be formed integrally with the display panel 300. In this case, the touch driving electrodes and the touch sensing electrodes of the touch sensing device 200 may be formed on the thin-film encapsulation layer of the display panel 300.

Figure 3:
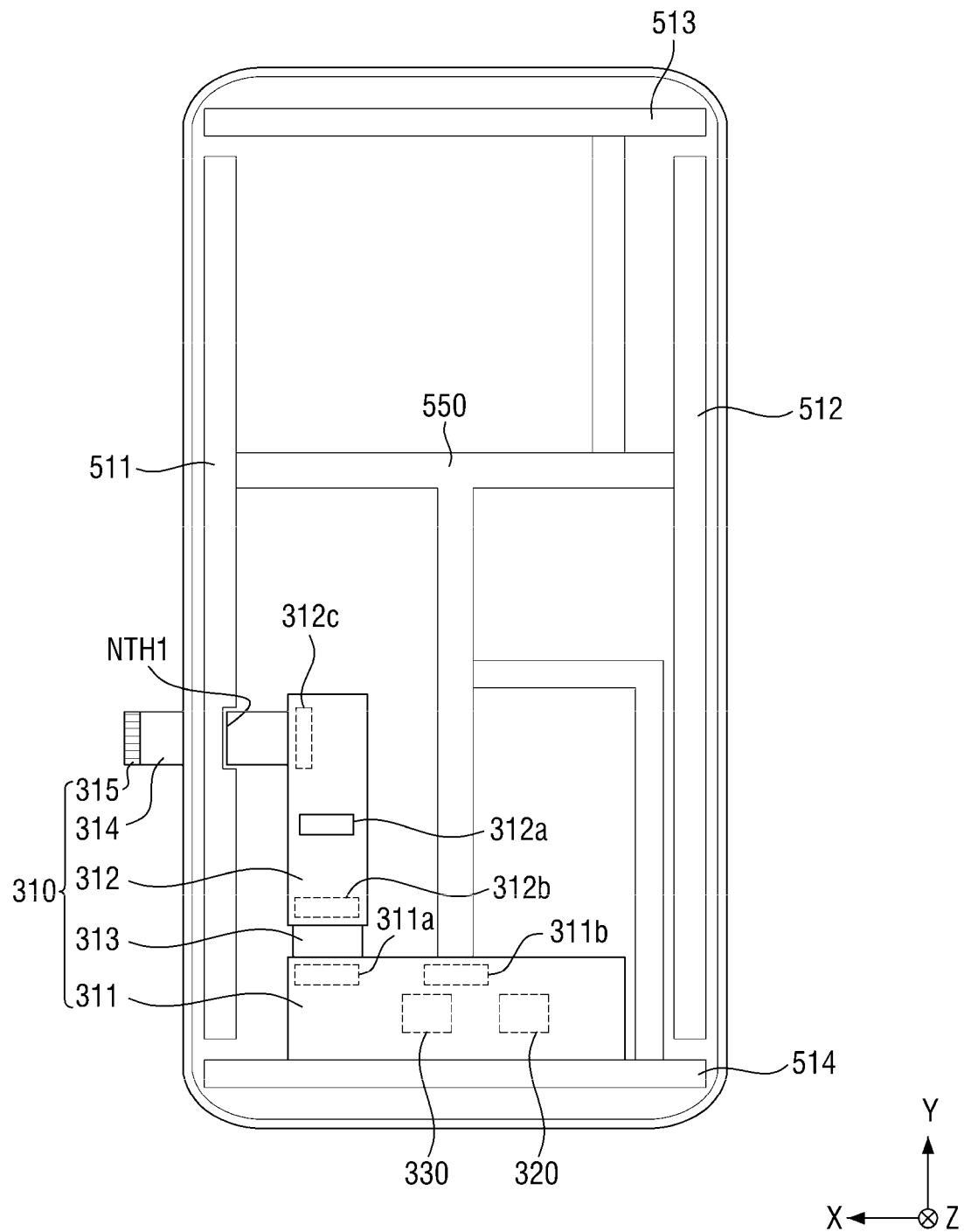
FIG. 3 is a view showing an example of the bottom of a display panel according to an exemplary embodiment of the present invention.

A touch circuit board 210 may be attached to one side of the touch sensing device 200. Specifically, one side of the touch circuit board 210 may be attached to pads disposed on one side of the touch sensing device 200 using an anisotropic conductive film. In addition, a touch connection portion may be disposed on the other side of the touch circuit board 210. The touch connection portion may be connected to a touch connector of the display circuit board 310, as shown in FIG. 3. The touch circuit board may be a flexible printed circuit board.

The touch driver 220 may apply touch driving signals to the touch driving electrodes of the touch sensing device 200, may sense sensing signals from the touch sensing electrodes of the touch sensing device 200, and may calculate a user's touch position by analyzing the sensing signals. The touch driver 220 may be formed as an integrated circuit and mounted on the touch circuit board 210.

The display panel 300 may be disposed under the touch sensing device 200. The display panel 300 may be disposed in the first region DR1, the second regions DR2, and the third regions DR3. Accordingly, the images on the display panel 300 can be seen not only in the first region DR1 but also in the second regions DR2 and the third regions DR3.

The display panel 300 may be a light-emitting display panel including a light-emitting element. For example, the display panel 300 may include an organic light-emitting display panel using organic light-emitting diodes, a micro light-emitting diode display panel using micro LEDs, and a quantum-dot light-emitting display panel including quantum-dot light-emitting diodes.

The display panel 300 may include a substrate, a thin-film transistor layer disposed on the substrate, a light-emitting element layer, and a thin-film encapsulation layer.

Since the display panel 300 is flexible, it can be formed of plastic. Then, the substrate may include a flexible substrate and a support substrate. Because the support substrate supports the flexible substrate, it may be less flexible. Each of the flexible substrate and the support substrate may include a flexible polymer material. For example, each of the flexible substrate and the support substrate may be polyethersulphone (PES), polyacrylate (PA), polyacrylate (PAR), polyetherimide (PEI), polyethylenenapthalate (PEN), polyethyleneterepthalate (PET), polyphenylenesulfide (PPS), polyallylate, polyimide (PI), polycarbonate (PC), cellulosetriacetate (CAT), cellulose acetate propionate (CAP), or combinations thereof.

A thin film transistor layer is disposed on the substrate. The thin film transistor layer may include scan lines, data lines, and thin film transistors. Each of the thin film transistors includes a gate electrode, a semiconductor layer, and source and drain electrodes. When a scan driver is formed directly on the substrate, it may be formed together with the thin film transistor layer.

The light-emitting element layer is disposed on the thin film transistor layer. The light-emitting element layer includes anode electrodes, an emissive layer, a cathode electrode, and banks. The emissive layer may include an organic emissive layer containing an organic material. For example, the emissive layer may include a hole injection layer, a hole transporting layer, an organic light-emitting layer, an electron transporting layer, and an electron injection layer. The hole injection layer and the electron injection layer may not be included. When a voltage is applied to the anode electrode and the cathode electrode, the holes and electrons move to the organic emissive layer through the hole transporting layer and the electron transporting layer, respectively, such that they combine internal organic emissive layer to emit light. The light-emitting element layer may be a pixel array layer where pixels are formed. Accordingly, the region where the light-emitting element layer is formed may be defined as a display area for displaying images. The peripheral area of the display area may be defined as a non-display area.

A thin encapsulation layer is disposed on the light-emitting element layer. The thin encapsulation layer serves to prevent permeation of oxygen or moisture into the light-emitting element layer. The thin encapsulation layer may include at least one inorganic layer and at least one organic layer.

The display circuit board 310 may be attached to one side of the display panel 300. Specifically, one side of the display circuit board 310 may be attached to pads disposed on one side of the display panel 300 using an anisotropic conductive film. The display circuit board 310 can be bent toward the lower surface of the display panel 300. The touch circuit board 210 may also be bent toward the lower surface of the display panel 300. Accordingly, the touch connection portion disposed at one end of the touch circuit board 210 may be connected to the touch connector 312a of the display circuit board 310. The display circuit board 310 will be described in detail with reference to FIGS. 3 and 4.

The display driver 320 outputs signals and voltages for driving the display panel 300 through the display circuit board 310. The display driver 320 may be formed as an integrated circuit and mounted on the display circuit board 310, but the inventive concepts are not limited thereto. For example, the display driver 320 may be directly mounted on the substrate of the display panel 300, specifically, on the upper surface or the lower surface of the substrate of the display panel 300.

A panel support member 390 may be disposed under the display panel 300 as shown in FIGS. 14A-14C. The panel support member 390 may be attached to the lower surface of the display panel 300 through a third adhesive member 930. The third adhesive member 930 may be a transparent adhesive film (OCA) or a transparent adhesive resin (OCR).

The panel support member 390 may include at least one of a light-absorbing member for absorbing light incident from outside, a buffer member for absorbing external impact, a heat dissipating member for efficiently discharging heat from the display panel 300, and a light-blocking layer for blocking light incident from outside.

The light-absorbing member may be disposed under the display panel 300. The light-absorbing member blocks the transmission of light to prevent the elements disposed under the light-absorbing member 410 from being seen from above the display panel 300, such as the first pressure sensor 511, the second pressure sensor 512, the third pressure sensor 513, the fourth pressure sensor 514, and the display circuit board 310. The light-absorbing member may include a light absorbing material, such as a black pigment or a dye.

The buffer member may be disposed under the light-absorbing member. The buffer member absorbs an external impact to prevent the display panel 300 from being damaged. The buffer member may be made up of a single layer or multiple layers. For example, the buffer member may be formed of a polymer resin such as polyurethane, polycarbonate, polypropylene and polyethylene, or may be formed of a material having elasticity, such as rubber and a sponge obtained by foaming a urethane-based material or an acrylic-based material. The buffer member may be a cushion layer.

The heat dissipating member may be disposed under the buffer member. The heat dissipation member may include a first heat dissipation layer including graphite or carbon nanotubes, and a second heat dissipation layer formed of a thin metal film such as copper, nickel, ferrite, and silver, which can block electromagnetic waves and have high thermal conductivity.

Each of the first pressure sensor 511, the second pressure sensor 512, the third pressure sensor 513, and the fourth pressure sensor 514 may be disposed at the edges of the first region DR1 and in the second regions DR2 and the third regions DR3. It is, however, to be understood that the inventive concepts are not limited thereto. The first pressure sensor 511, the second pressure sensor 512, the third pressure sensor 513, and the fourth pressure sensor 514 are disposed from the second regions DR2 to the third regions DR3, or may be disposed only in the third regions DR3. Icon navigations may be disposed at the edges of the first region DR1 such that they are in line with the first pressure sensor 511, the second pressure sensor 512, the third pressure sensor 513, and the fourth pressure sensor 514, respectively, to indicate the positions of the pressure sensitive cells to the user.

The first pressure sensor 511 may be disposed on the first longer side LS1 of the display device 10 and under the display panel 300. The second pressure sensor 512 may be disposed on the second longer side LS2 of the display device 10 and under the display panel 300. The first pressure sensor 511 and the second pressure sensor 512 may be disposed such that they face each other in the first direction (x-axis direction).

The third pressure sensor 513 may be disposed on the first shorter side SS1 of the display device 10 and under the display panel 300. The fourth pressure sensor 514 may be disposed on the second shorter side SS2 of the display device 10 and under the display panel 300. The third pressure sensor 513 and the fourth pressure sensor 514 may be disposed such that they face each other in the second direction (y-axis direction).

Each of the first pressure sensor 511, the second pressure sensor 512, the third pressure sensor 513, and the fourth pressure sensor 514 may be attached to the lower surface of the panel support member 390. Each of the first pressure sensor 511, the second pressure sensor 512, the third pressure sensor 513, and the fourth pressure sensor 514 may be connected to the display circuit board 310 via the pressure sensing circuit board 550. Although the first pressure sensor 511, the second pressure sensor 512, the third pressure sensor 513, and the fourth pressure sensor 514 are connected to the single pressure sensing circuit board 550 in FIG. 3, this is merely illustrative. The first pressure sensor 511, the second pressure sensor 512, the third pressure sensor 513, and the fourth pressure sensor 514 may be connected to the display circuit board 310 via different pressure sensing circuit boards, respectively.

As shown in FIG. 3, on the display circuit board 310, the pressure sensing unit 330 may be disposed to drive the first pressure sensor 511, the second pressure sensor 512, the third pressure sensor 513, and the fourth pressure sensor 514 to sense a pressure. The pressure sensing unit 330 may be implemented as an integrated circuit. The pressure sensing unit 330 may be integrated with the display driver 320 to form a single integrated circuit.

Alternatively, the pressure sensing circuit board 550 may be connected to the touch circuit board 210 rather than the display circuit board 310. Then, the pressure sensing unit 330 may be mounted on the touch circuit board 210. The pressure sensing unit 330 may be integrated with the touch driver 220 to form a single integrated circuit.

The middle frame 600 may be disposed below the panel support member 390. The middle frame 600 may include a synthetic resin, a metal, or both a synthetic resin and a metal.

In an exemplary embodiment, the waterproof member 400 may be disposed at the edge of the middle frame 600. For example, the waterproof member 400 may surround the ends of the side surfaces of the middle frame 600. It is, however, to be understood that this is merely illustrative.

The waterproof member 400 may be disposed on the outer side of each of the first pressure sensor 511, the second pressure sensor 512, the third pressure sensor 513, and the fourth pressure sensor 514. The waterproof member 400 may be attached to the lower surface of the panel support member 390 and the upper surface of the middle frame 600.

According to the exemplary embodiment of the present invention shown in FIGS. 1 and 2, the waterproof member 400 is disposed on the outer side of the first pressure sensor 511, the second pressure sensor 512, the third pressure sensor 513, and the fourth pressure sensor 514, and thus it is possible to prevent moisture and dust from permeating between the display panel 300 and the middle frame 600 by the waterproof member 400. That is to say, the display device 10 with waterproof and dustproof capabilities can be produced.

In the middle frame 600, a first camera hole CMH1 for inserting a camera device 720, a battery hole BH for dissipating the heat from a battery, and a cable hole FH through which a second connection cable 314 connected to the display circuit board 310 passes. Specifically, the cable hole CAH may be disposed adjacent to the right edge of the middle frame 600, and may be covered by the first pressure sensor 511 disposed under the display panel 300 at the right edge of the display panel 300. Accordingly, the first pressure sensor 511 may include a first notch NTH on a side thereof for exposing the cable hole CAH, as shown in FIG. 2.

The middle frame 600 is disposed under the panel support member 390 of the display panel 300, the first pressure sensor 511, the second pressure sensor 512, the third pressure sensor 513, and the fourth pressure sensor 514. The middle frame 600 can support the first pressure sensor 511, the second pressure sensor 512, the third pressure sensor 513, and the fourth pressure sensor 514 when a pressure is applied to the first pressure sensor 511, the second pressure sensor 512, the third pressure sensor 513, and the fourth pressure sensor 514. Accordingly, the first pressure sensor 511, the second pressure sensor 512, the third pressure sensor 513, and the fourth pressure sensor 514 may sense the applied pressure sensor.

The main circuit board 700 may be disposed under the middle frame 600. The main circuit board 700 may be either a printed circuit board or a flexible printed circuit board.

The main circuit board 700 may include a main processor 710, a camera device 720, and a main connector 730. The main processor 710 and the main connector 730 may be disposed on the lower surface of the main circuit board 700 facing the bottom cover 900. In addition, the camera device 720 may be disposed on both upper and lower surfaces of the main circuit board 700.

The main processor 710 may control all the functions of the display device 10. For example, the main processor 710 may output image data to the display driver 320 of the display circuit board 310 so that the display panel 300 displays an image. In addition, the main processor 710 may receive touch data from the touch driver 220 to determine the position of the user's touch, and then may execute an application indicated by the icon displayed at the position of the user's touch. In addition, the main processor 710 may receive pressure sensing data from the touch driver 220 or the pressure sensing unit 330 to run an application indicated by an icon at the position of the user's pressure according to the pressure sensing data. In addition, the main processor 710 may vibrate the vibration generator according to the pressure sensing data to provide a haptic feedback. The main processor 710 may be an application processor, a central processing unit, or a system chip implemented as an integrated circuit.

The camera device 720 processes image frames such as still image and video obtained by the image sensor in the camera mode and outputs them to the main processor 710.

The second connection cable 314 passing through the connector hole FH of the middle frame 600 may be connected to the main connector 730 disposed on the lower surface of the main circuit board 700 via a gap between the middle frame 600 and the main circuit board 700. Accordingly, the main circuit board 700 may be electrically connected to the display circuit board 310 and the touch circuit board 210.

Besides, a mobile communications module capable of transmitting/receiving a radio signal to/from at least one of a base station, an external terminal, and a server over a mobile communications network may be further mounted on the main circuit board 700. The wireless signal may include various types of data depending on a voice signal, a video call signal, or a text/multimedia message transmission/reception. In addition, the main circuit board 700 may further include an audio output device capable of outputting sound, such as a speaker.

In an exemplary embodiment, the bottom cover 900 may be disposed below the middle frame 600 and the main circuit board 700. The bottom cover 900 may be fastened and fixed to the middle frame 600. For example, the bottom cover 900 may support the side surfaces of the cover window 100, the touch sensing device 200, the display panel 300 and the panel support member 390 which area the ends of the third regions DR3. It is, however, to be understood that the inventive concepts are not limited thereto. The bottom cover 900 may cover the side surfaces and a part of the upper surface of each of the cover window 100, the touch sensing device 200, the display panel 300, and the panel support member 390 in the third regions DR3.

The bottom cover 900 may form the exterior of the lower surface of the display device 10. The bottom cover 900 may include plastic and/or metal. A second camera hole CMH2 may be formed in the bottom cover 900 via which the camera device 720 is inserted to protrude to the outside. The positions of the camera device 720 and the first and second camera holes CMH1 and CMH2 in line with the camera device 720 are not limited to those of the exemplary embodiment shown in FIGS. 1, 2, 4 and 5.

Figure 4:
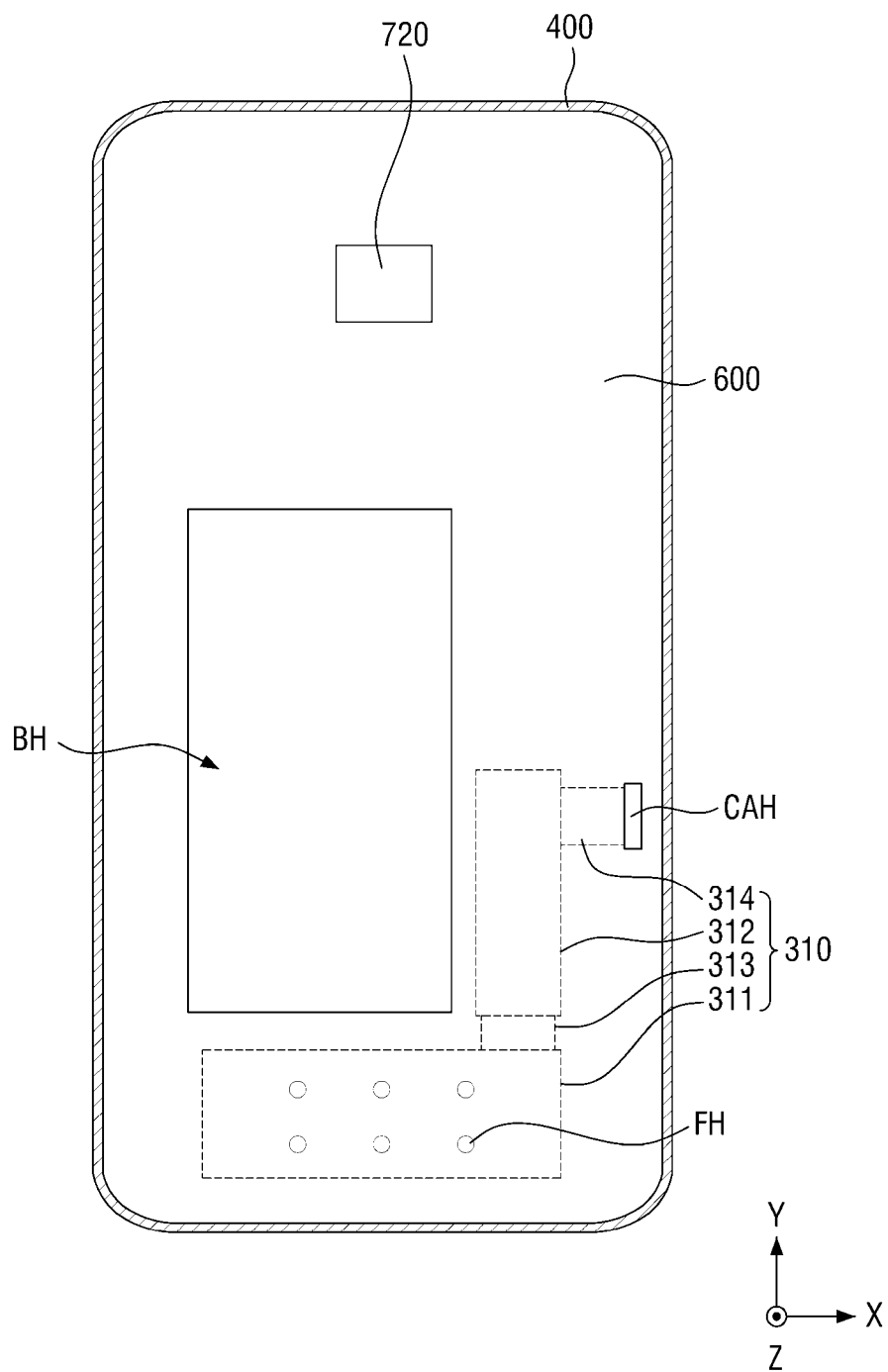
FIG. 4 is a plan view showing an example of a middle frame according to an exemplary embodiment of the present invention.
Figure 5:
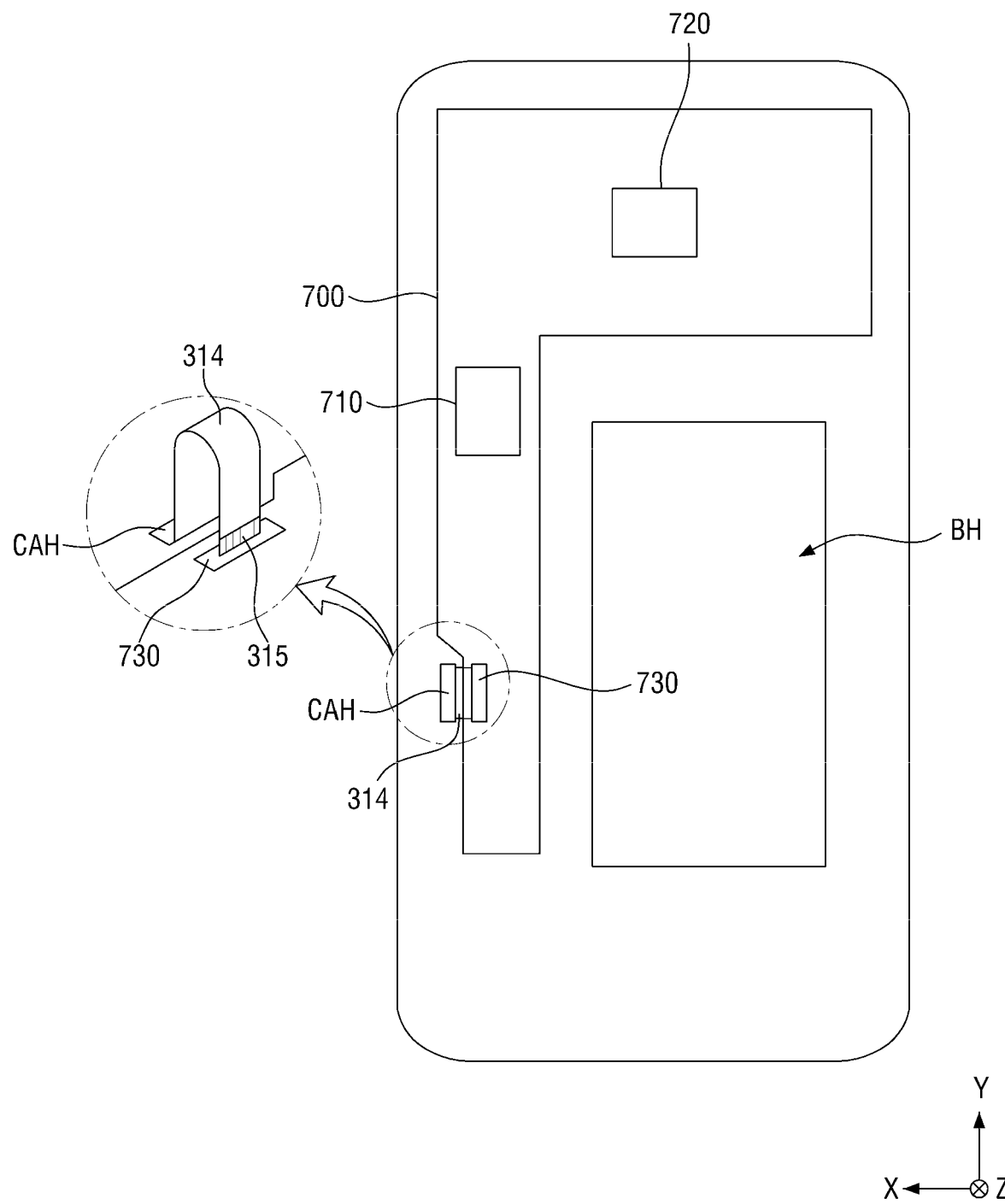
FIG. 5 is a bottom view of a middle frame and a main circuit board according to an exemplary embodiment of the present invention.

FIG. 3 is a bottom view showing an example of a display panel according to an exemplary embodiment of the present invention. FIG. 4 is a plan view showing an example of a middle frame according to an exemplary embodiment of the present invention. FIG. 5 is a bottom view of a middle frame and a main circuit board according to an exemplary embodiment of the present invention.

Hereinafter, referring to FIGS. 3 to 5, the connection between the display circuit board 310 and the third circuit board 550 and the connection between the second connection cable 314 and the main connector 730 of the main circuit board 700 will be described in detail. It is to be noted that FIG. 4 is a plan view while FIGS. 3 and 5 are bottom views and thus the left and right of the display device 10 in FIG. 4 are reversed in FIGS. 3 and 5. For convenience of illustration, the display circuit board 310 is depicted with a dashed line in FIG. 4, and the second connection cable 314 is depicted in a circle with a dot-dash line.

Referring to FIGS. 3 to 5, the display circuit board 310 may include a first circuit board 311, a second circuit board 312, and a first connection cable 313.

The first circuit board 311 may be attached to one side of the upper surface or the lower surface of the substrate of the display panel 300 and may be bent toward the lower surface of the substrate of the display panel 300. The first circuit board 311 may be fixed in the fixing holes FH formed in the middle frame 600 by fixing members as shown in FIG. 4.

The first circuit board 311 may include a display driver 320, a pressure sensing unit 330, a first connector 311a, and a second connector 311b. The display driver 320, the pressure sensing unit 330, the first connector 311a, and the second connector 311b may be disposed on the surface of the first circuit board 311.

The first connector 311a may be connected to one end of the first connection cable 313 connected to the second circuit board 312. The display driver 320 and the pressure sensing unit 330 mounted on the first circuit board 311 may be electrically connected to the second circuit board 312 via the first connection cable 313.

The second connector 311b may be connected to one end of the third circuit board 550 connected to the first pressure sensor 511, the second pressure sensor 512, the third pressure sensor 513, and the fourth pressure sensor 514. Accordingly, the first pressure sensor 511, the second pressure sensor 512, the third pressure sensor 513, and the fourth pressure sensor 514 may be electrically connected to the pressure sensing unit 330.

The second circuit board 312 may include a touch connector 312a, a first connector 312b, and a second connector 312c. The first connector 312b and the second connector 312c may be disposed on one surface of the second circuit board 312, and the touch connector 312a may be disposed on the other surface of the second circuit board 312.

The touch connector 312a may be connected to a touch connection portion disposed on one end of the touch circuit board 210. Accordingly, the touch driver 220 may be electrically connected to the second circuit board 312.

The first connector 312b may be connected to the other end of the first connection cable 313 connected to the first circuit board 311. The display driver 320 and the pressure sensing unit 330 mounted on the first circuit board 311 may be electrically connected to the second circuit board 312 via the first connection cable 313.

The second connector 312c may be connected to one end of a second connection cable 314 connected to the main connector 730 of the main circuit board 700. Thus, the second circuit board 312 may be electrically connected to the second circuit board 312 through the second connection cable 314.

A connecting portion 315 may be formed at the other end of the second connection cable 314. The connecting portion 315 of the second connection cable 314 may be extended below the middle frame 600 through the cable hole CAH of the middle frame 600 as shown in FIGS. 3 and 4. Since a first notch NTH1 is formed in the inner side of the first pressure sensor 511 in line with the cable hole CAH of the middle frame 600, the cable hole CAH of the middle frame 600 can be exposed without being covered by the first pressure sensor 511.

Since there is a gap between the middle frame 600 and the main circuit board 700 as shown in FIG. 5, the connecting portion 315 of the second connection cable 314 passes through the cable hole CAH and then comes out of the gap between the middle frame 600 and the maintain circuit board 700 to be extended under the main circuit board 700. Ultimately, the connector connecting portion 315 of the second connection cable 314 may be connected to the main connector 730 disposed on the lower surface of the main circuit board 700.

According to the exemplary embodiment shown in FIGS. 3 to 5, a notch NTH is formed on one side of the first pressure sensor 511 so as not to cover the cable hole CAH of the middle frame 600. Accordingly, the second connection cable 314 connected to the display circuit board 310 may be extended below the middle frame 600 through the cable hole CAH and may be connected to the main connector 730 of the main circuit board 700. Therefore, the display circuit board 310 can be connected to the main circuit board 700 stably.

Figure 6:
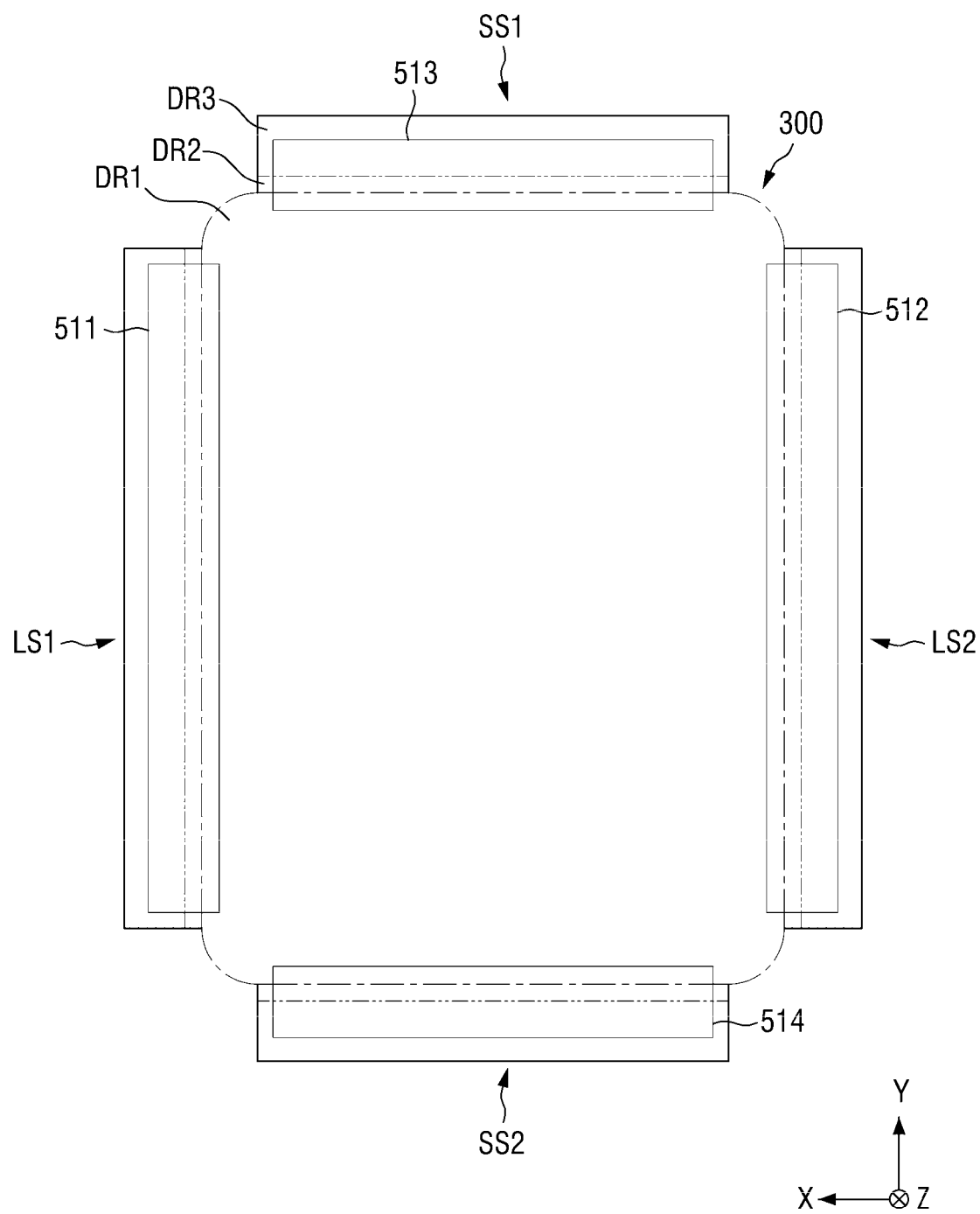
FIG. 6 is a bottom view showing pressure sensors disposed in the display panel according to an exemplary embodiment of the present invention.

FIG. 6 is a bottom view showing pressure sensors disposed in the display panel according to an exemplary embodiment of the present disclosure;

Referring to FIG. 6, according to an exemplary embodiment of the present invention, a display panel 300 may include a first region DR1, a second region DR2, and a third region DR3. For example, the second region DR2 may be extended from the first region DR1 toward one of the first and second shorter sides SS1 and SS2 and the first and second longer sides LS1 and LS2. The third region DR3 may be extended from the second region DR2 toward one of the first and second shorter sides SS1 and SS2 and the first and second longer sides LS1 and LS2. It is, however, to be understood that the inventive concepts are not limited thereto. The second region DR2 and the third region DR3 may be disposed such that they surround the first region DR1. Although the length of the longer side of each of the second region DR2 and the third region DR3 is shown as being smaller than the length of the side of the first region DR1, this is merely illustrative. The length of the longer side of each of the second regions DR2 and the third regions DR3 extended from each side of the first region DR1 may be equal to the length of the side of the first region DR1.

The second region DR2 and the third region DR3 of the display panel 300 may be bent from the first region DR1 during the process of forming the display device 10. For example, the first region DR1 of the display panel 300 may correspond to a flat portion as the main display area. The second region DR2 may correspond to a curved portion extended from the first region DR1. The third region DR3 may correspond to a side surface of the second region DR2 as a vertical portion extended from the end to the bottom. It is, however, to be understood that the inventive concepts are not limited thereto. The second region DR2 may be a flat portion inclined from the first region DR1 at a predetermined angle. The third region DR3 may be a curved portion extended from the second region DR2 with a constant curvature. As such, the display panel 300 further includes the second region DR2 and the third region DR3 extended from the first region DR1, so that the display device 10 can display images on the even four side surfaces as well as the upper surface.

In an exemplary embodiment, the first pressure sensor 511, the second pressure sensor 512, the third pressure sensor 513, and the fourth pressure sensor 514 are disposed under the display panel. Specifically, the first pressure sensor 511 may be disposed adjacent to the first longer side LS1 under the display panel 300 and may be extended in the second direction (y-axis direction). The second pressure sensor 512 may be disposed adjacent to the second longer side LS2 under the display panel 300 and may be extended in the second direction (y-axis direction). The third pressure sensor 513 may be disposed adjacent to the second longer side SS1 under the display panel 300 and may be extended in the first direction (x-axis direction). The fourth pressure sensor 514 may be disposed adjacent to the second shorter side SS2 under the display panel 300 and may be extended in the first direction (x-axis direction). The first pressure sensor 511 and the second pressure sensor 512 may face each other in the first direction (x-axis direction). The third pressure sensor 513 and the fourth pressure sensor 514 may face each other in the second direction (y-axis direction).

Each of the first pressure sensor 511, the second pressure sensor 512, the third pressure sensor 513, and the fourth pressure sensor 514 may be disposed at the edges of the first region DR1 and in the second regions DR2 and the third region DR3. It is, however, to be understood that the inventive concepts are not limited thereto. Each of the first pressure sensor 511, the second pressure sensor 512, the third pressure sensor 513, and the fourth pressure sensor 514 are disposed from the second regions DR2 to the third regions DR3 or may be disposed only in the third regions DR3. In addition, one or more of the first pressure sensor 511, the second pressure sensor 512, the third pressure sensor 513, and the fourth pressure sensor 514 may be disposed at the edges of the first region DR1, in the second regions DR2, and the third regions DR3. Others may be disposed from the second regions DR2 to the third regions DR3. Each of the first pressure sensor 511, the second pressure sensor 512, the third pressure sensor 513, and the fourth pressure sensor 514 may be disposed in different regions, respectively.

Each of the first pressure sensor 511, the second pressure sensor 512, the third pressure sensor 513, and the fourth pressure sensor 514 may be bent together with the display panel 300 during the process of forming the display device 10, and can be assembled. Accordingly, the first pressure sensor 511, the second pressure sensor 512, the third pressure sensor 513, and the fourth pressure sensor 514 can sense a pressure at the four edges of the upper surface and the four side surfaces of the display device 10.

Figure 7:
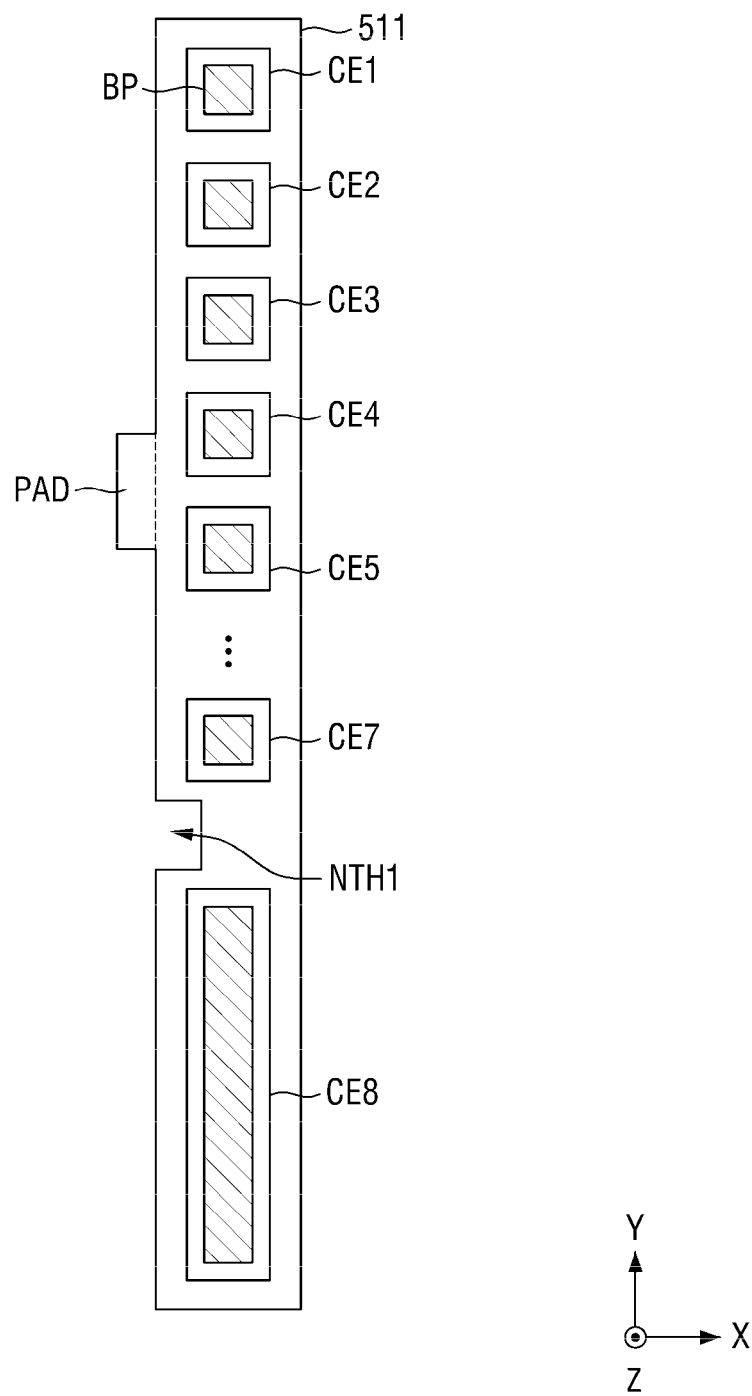
FIG. 7 is a plan view showing a first pressure sensor and bumps according to an exemplary embodiment of the present invention.
Figure 8:
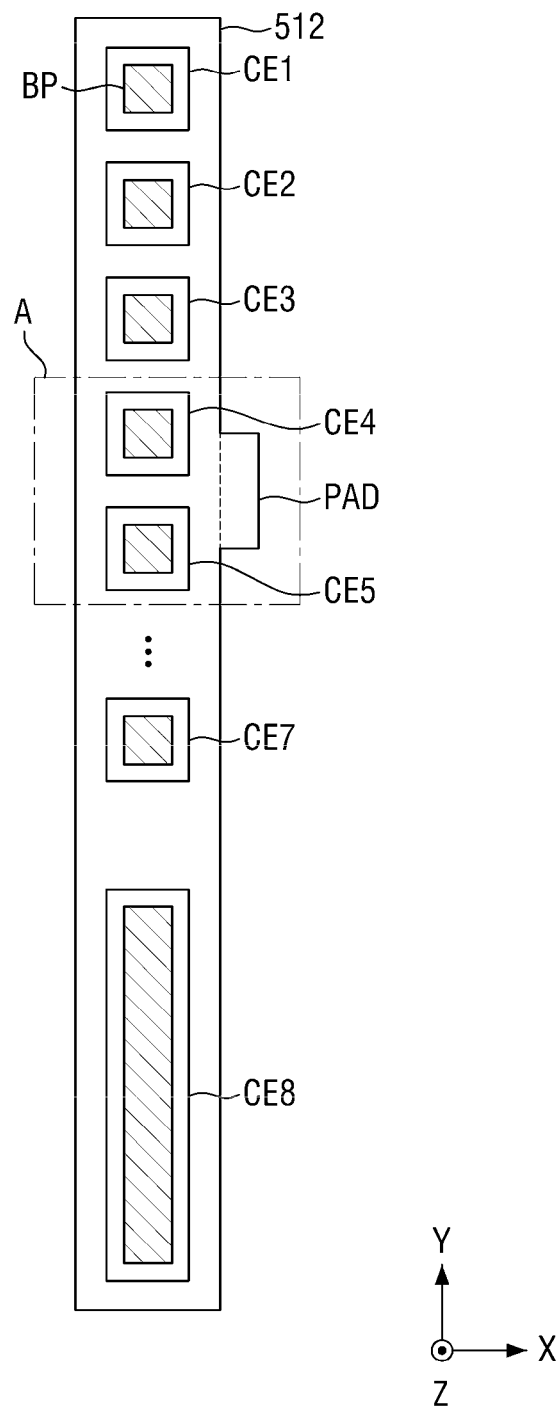
FIG. 8 is a plan view showing a second pressure sensor and bumps according to an exemplary embodiment of the present invention.

FIG. 7 is a plan view showing a first pressure sensor and bumps according to an exemplary embodiment of the present invention. FIG. 8 is a plan view showing a second pressure sensor and bumps according to an exemplary embodiment of the present invention.

Referring to FIG. 7, the first pressure sensor 511 may have a rectangular shape having shorter sides in a first direction (x-axis direction) and longer sides in a second direction (y-axis direction) when viewed from the top. It is, however, to be understood that the inventive concepts are not limited thereto. The shape of the first pressure sensor 511 may vary depending on where it is disposed.

The first pressure sensor 511 includes a plurality of pressure sensitive cells CE1 to CE8. Although the first pressure sensor 511 shown in FIG. 7 includes eight pressure sensitive cells CE1 to CE8, the number of the pressure sensitive cells CE1 to CE8 is not limited to eight.

Each of the pressure sensitive cells CE1 to CE8 may individually sense the pressure at the respective positions. Although the pressure sensitive cells CE1 to CE8 shown in FIG. 7 are arranged in a single row, the inventive concepts are not limited thereto. The pressure sensitive cells CE1 to CE8 may be arranged in several rows as desired. In addition, the pressure sensitive cells CE1 to CE8 may be arranged at predetermined intervals as shown in FIG. 7 or may be arranged continuously.

Figure 13:
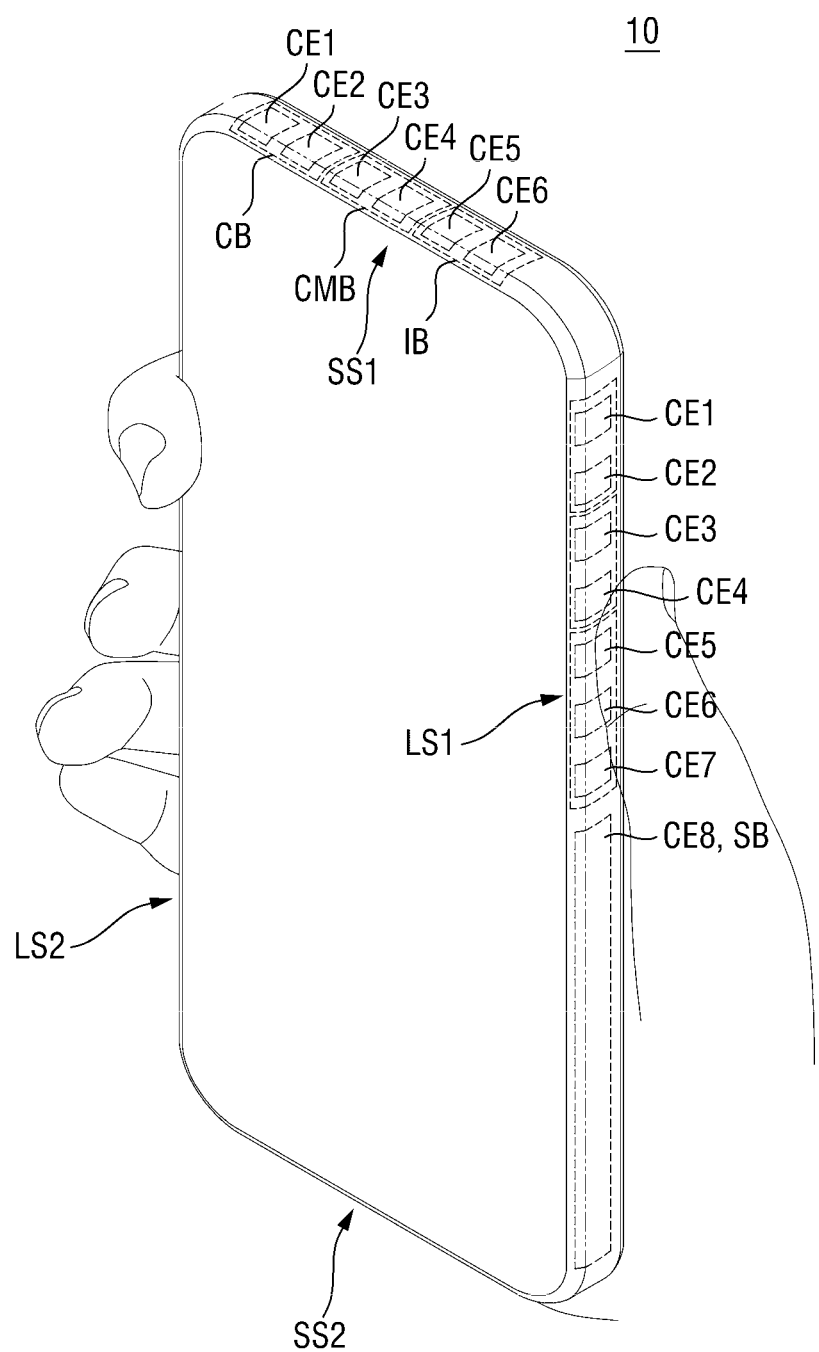
FIG. 13 is a view showing an example of a display device in which pressure sensors are used as physical buttons according to an exemplary embodiment of the present invention.

The pressure sensitive cells CE1 to CE8 may have different areas depending on the use. For example, as shown in FIG. 13, the first to seventh pressure sensitive cells CE1 to CE7 may be used as physical buttons, such as volume control buttons VB+ and VB− and a power button PB disposed on the edge of one side and the side surface of the display device 10. The eighth pressure sensitive cell CE8 may be used as a button SQB for sensing a user's squeezing pressure. The eighth pressure sensitive cell CE8 may be formed to have a larger area than the first to seventh pressure sensitive cells CE1 to CE7. The eighth pressure sensitive cell CE8 may be longer than the first to seventh pressure sensitive cells CE1 to CE7 in the longitudinal direction (y-axis direction) of the first pressure sensor 511.

Additionally, although the first to seventh pressure sensitive cells CE1 to CE7 used as physical buttons have the same area in FIG. 7, the inventive concepts are not limited thereto. That is to say, the first to seventh pressure sensitive cells CE1 to CE7 may have different areas from one another. Alternatively, some of the first to seventh pressure sensitive cells CE1 to CE7 may have the same area while the others may have the same area, which is different from the area of the some of the pressure sensitive cells.

A plurality of bumps BP may be disposed on the first to eighth pressure sensitive cells CE1 to CE8, respectively, such that they overlap with the first to eighth pressure sensitive cells CE1 to CE8, respectively. The bumps are used to press the first to eighth pressure sensitive cells CE1 to CE8 in proportional to a user's pressure. Accordingly, the user's pressure may be sensed by the first to eighth pressure sensitive cells CE1 to CE8.

In order to increase the pressure applied to the first to eighth pressure sensitive cells CE1 to CE8 by the bumps BP, each of the bumps BP may have a smaller area than the respective pressure sensitive cells CE1 to CE8. The bumps BP may be formed in an area smaller than the pressure sensing layers PSL (see FIG. 12) of the first to eighth pressure sensitive cells CE1 to CE8, respectively.

The area of each of the bumps BP may be proportional to the area of the respective pressure sensitive cells. For example, as shown in FIG. 7, when the area of the eighth pressure sensitive cell CE8 is larger than the area of each of the first to seventh pressure sensitive cells CE1 to CE7, the area of the bump BP on the eighth pressure sensitive cell CE8 may be larger than the area of the each of the bumps BP on the first to seventh pressure sensitive cells CE1 to CE7.

In addition, in order not to cover the cable hole CAH of the middle frame 600, a first notch NTH1 may be formed at the portion of the first pressure sensor 511 that is in line with the cable hole CAH of the middle frame 600.

The second pressure sensor 512 and the bumps BP shown in FIG. 8 are identical to the first pressure sensor 511 and the bumps BP shown in FIG. 7, respectively, except that the second pressure sensor 512 does not include the first notch NTH1. The second pressure sensor 512 and the bumps BP shown in FIG. 8 will not be described in detail.

Figure 9:
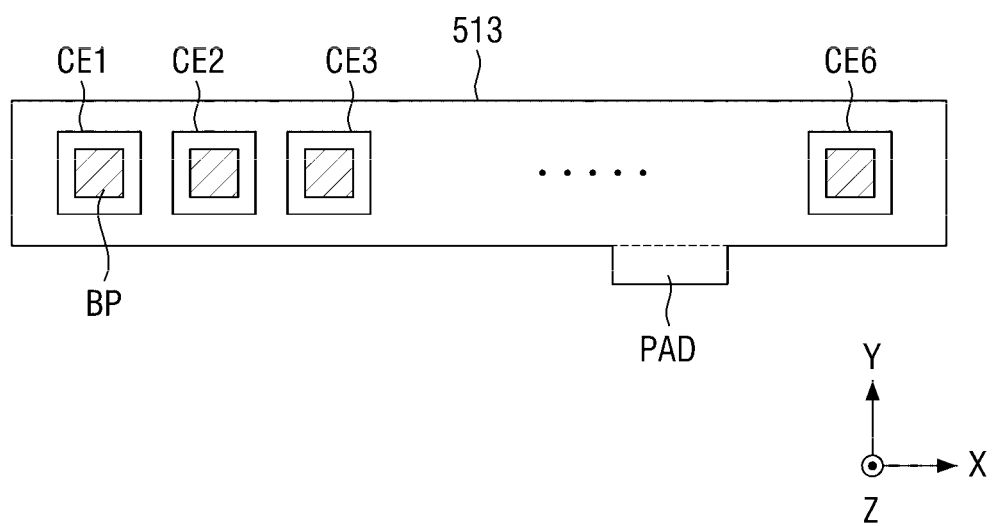
FIG. 9 is a plan view showing a third pressure sensor and bumps according to an exemplary embodiment of the present invention.
Figure 10:
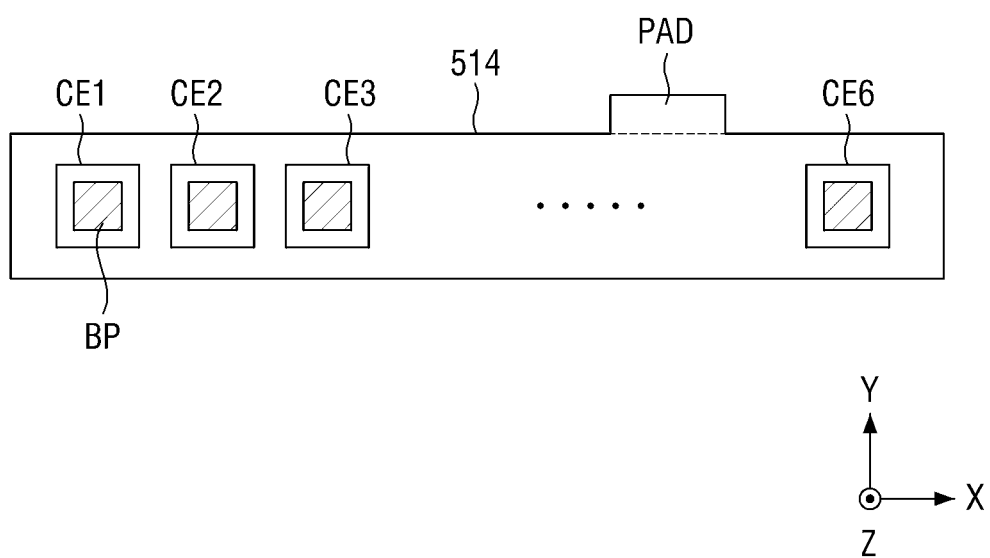
FIG. 10 is a plan view showing a fourth pressure sensor and bumps according to an exemplary embodiment of the present invention.

FIG. 9 is a plan view showing a third pressure sensor and bumps according to an exemplary embodiment of the present invention. FIG. 10 is a plan view showing a fourth pressure sensor and bumps according to an exemplary embodiment of the present invention.

Referring to FIG. 9, the third pressure sensor 513 may have a rectangular shape having shorter sides in the second direction (y-axis direction) and longer sides in the first direction (x-axis direction) when viewed from the top. It is, however, to be understood that the inventive concepts are not limited thereto. The shape of the third pressure sensor 513 may vary depending on where it is disposed.

The third pressure sensor 513 includes a plurality of pressure sensitive cells CE1 to CE6. Although the third pressure sensor 513 shown in FIG. 9 includes six pressure sensitive cells CE1 to CE6, the number of the pressure sensitive cells CE1 to CE6 is not limited to six.

Each of the pressure sensitive cells CE1 to CE6 may individually sense the pressure at the respective positions. Although the pressure sensitive cells CE1 to CE6 shown in FIG. 9 are arranged in a single row, the inventive concepts are not limited thereto. The pressure sensitive cells CE1 to CE6 may be arranged in several rows as desired. In addition, the pressure sensitive cells CE1 to CE6 may be arranged at predetermined intervals as shown in FIG. 9 or may be arranged continuously.

The pressure sensitive cells CE1 to CE6 may have different areas depending on the use. For example, as shown in FIG. 13, the first to sixth pressure sensitive cells CE1 to CE6 may be used as physical buttons such as a call button CB, a camera button CMB and an Internet button D3 disposed on the edge of one side and the side surface of the display device 10.

Additionally, although the first to sixth pressure sensitive cells CE1 to CE6 used as physical buttons have the same area in FIG. 9, the inventive concepts are not limited thereto. That is to say, the first to sixth pressure sensitive cells CE1 to CE6 may have different areas from one another. Alternatively, some of the first to sixth pressure sensitive cells CE1 to CE6 may have the same area while the others may have the same area, which is different from the area of the some of the pressure sensitive cells.

A plurality of bumps BP may be disposed on the first to sixth pressure sensitive cells CE1 to CE6, respectively, such that they overlap with the first to sixth pressure sensitive cells CE1 to CE6, respectively. The bumps are used to press the first to sixth pressure sensitive cells CE1 to CE6 in proportional to a user's pressure. Accordingly, the user's pressure may be sensed by the first to sixth pressure sensitive cells CE1 to CE6.

Since the fourth pressure sensor 514 and the bumps BP shown in FIG. 10 are substantially identical to the third pressure sensor 513 and the bumps BP, the fourth pressure sensor 514 and the bumps BP shown in FIG. 10 will not be described to avoid redundancy.

FIG. 11 is a plan view of area A shown in FIG. 8. FIG. 12 is a cross-sectional view taken along line III-III' of FIG. 11.

Referring to FIGS. 11 and 12, the second pressure sensor 512 includes a first substrate SUB1, a second substrate SUB2, a driving line TL, first to eighth sensing lines RL1 to RL8, a driving pad TP, first to eighth sensing pads RP1 to RP8, and first to eighth pressure sensitive cells CE1 to CE8.

FIG. 11 shows only the fourth pressure sensitive cell CE4, the fifth pressure sensitive cell CE5, and the pad area PAD for convenience of illustration. In FIG. 8, the second substrate SUB2 is not shown for convenience of illustration.

The first substrate SUB1 faces the second substrate SUB2. Each of the first substrate SUB1 and the second substrate SUB2 may include a material such as polyethylene, polyimide, polycarbonate, polysulfone, polyacrylate, polystyrene, polyvinyl chloride, polyvinyl alcohol, poly (norbornene), and polyester. According to an exemplary embodiment of the present invention, each of the first substrate SUB1 and the second substrate SUB2 may be formed as a polyethylene terephthalate (PET) film or a polyimide film.

The pressure sensitive cells CE1 to CE8 are disposed between the first substrate SUB1 and the second substrate SUB2. The driving line TL, the sensing lines RL1 to RL8, the driving pad TP, and the sensing pads RP1 to RP8 are disposed on one surface of the first substrate SUB1 facing the second substrate SUB2. The pressure sensitive cells CE1 to CE8 are disposed between the first substrate SUB1 and the second substrate SUB2.

Each of the pressure sensitive cells CE1 to CE8 may be connected to at least one driving line and at least one sensing line. For example, while the pressure sensitive cells CE1 to CE8 are commonly connected to the single driving line TL, they may be connected to the sensing lines RL1 to RL8, respectively. As shown in FIG. 11, the fourth pressure sensitive cell CE4 may be connected to the driving line TL and the fourth sensing line RL4, while the fifth pressure sensitive cell CE5 may be connected to the driving line TL and the fifth sensing line RL5.

The driving line TL may be connected to the driving pad TP, and the sensing lines RL1 to RL8 may be connected to the sensing pads RP1 to RP8, respectively. The first sensing line RL1 may be connected to the first sensing pad RP1, the second sensing line RL2 may be connected to the second sensing pad RP2, the third sensing line RL3 may be connected to the third sensing pad RP2, and the fourth sensing line RL4 may be connected to the fourth sensing pad RP4. The fifth sensing line RL5 may be connected to the fifth sensing pad RP5, the sixth sensing line RL6 may be connected to the sixth sensing pad RP6, the seventh sensing line RL7 may be connected to the seventh sensing pad RP7, and the eighth sensing line RL8 may be connected to the eighth sensing pad RP8.

The pad area PAD may protrude from one side of the first substrate SUB1. The side of the first substrate SUB1 may be the longer side of the first pressure sensor 511. Although the pad area PAD protrudes from the center of the longer side of the first substrate SUB1 in FIG. 8, the present disclosure is not limited thereto. That is to say, the pad area PAD may protrude from one end or the other end of the longer side of the first substrate SUB1.

The driving pad TP and the sensing pads RP1 to RP8 may be disposed in the pad area PAD. The driving pad TP and the sensing pads RP1 to RP8 may be connected to a driving lead line TL_F and sensing lead lines RL1_F to RL8_F of the third circuit board 550, respectively, through an anisotropic conductive film. The driving pad TP may be connected to the driving lead line TL_F, the first sensing pad RP1 may be connected to a first sensing lead line RL1_F, the second sensing pad RP2 may be connected to a second sensing lead line RL2_F, the third sensing pad RP3 may be connected to a third sensing lead line RL3_F, and the fourth sensing pad RP4 may be connected to a fourth sensing lead line RL4_F. In addition, the fifth sensing pad RP5 may be connected to the fifth sensing lead line RP5_F, the sixth sensing pad RP6 may be connected to the sixth sensing lead line RP6_F, the seventh sensing pad RP7 may be connected to the seventh sensing lead line RP7_F, and the eighth sensing pad RP8 may be connected to the eighth sensing lead line RP8_F.

As shown in FIGS. 3, 8, and 11, the third circuit board 550 is connected to the display circuit board 310 so that the third circuit board 550 may be electrically connected to the pressure sensing unit 330 mounted on the display circuit board 310. The pressure sensing unit 330 applies a driving voltage to the driving line TL through the driving lead line TL_F of the third circuit board 550 and the driving pad TP of the second pressure sensor 512, and senses the current values or voltage values from the sensing lines RL1 to RL8 through the sensing lead lines RL1_F to RL8_F connected to the sensing pads RP1 to RP8 of the first pressure sensor 511, to thereby sense the pressure applied to the pressure sensitive cells CE1 to CE8.

The second pressure sensor 512 may further include a coupling layer CK disposed between the first substrate SUB1 and the second substrate SUB2 to couple them together. The coupling layer CK may be implemented as a pressure-sensitive adhesive layer or an adhesive layer. The coupling layer CK may be disposed along the periphery of the first substrate SUB1 and the second substrate SUB2. In an exemplary embodiment, the coupling layer CK may completely surround the edges of the first substrate SUB1 and the second substrate SUB2 to seal the inside of the second pressure sensor 512. In addition, the coupling layer CK may serve as a spacer for maintaining the distance between the first substrate SUB1 and the second substrate SUB2. In FIG. 11, the coupling layer CK is not formed in the pad area PAD. Accordingly, no coupling layer overlaps with the driving line TL, the sensing lines RL1 to RLp, the pressure sensitive cells CE1 to CEp, the driving pad TP and the sensing pads RP1 to RP8. It is, however, to be understood that the inventive concepts are not limited thereto. For example, the coupling layer CK may be disposed such that it overlaps with the driving line TL, the sensing lines RL1 to RLp, the pressure sensitive cells CE1 to CEp, the driving pad TP and the sensing pads RP1 to RPp.

The coupling layer CK may be first attached to one surface of one of the first substrate SUB1 and the second substrate SUB2 and then attached to one surface of the other substrate during the process of attaching the first substrate SUB1 and the second substrate SUB2 together. As another example, a coupling layer CK may be disposed on each of one surface of the first substrate SUB1 and one surface of the second substrate SUB2, and then the coupling layer CK on the first substrate SUB1 may be attached to the coupling layer CK on the second substrate SUB2 during the process of attaching the first substrate SUB1 and the second substrate SUB2 together.

As shown in FIGS. 11 and 12, each of the pressure sensitive cells CE1 to CE8 includes a driving connection electrode TCE, a sensing connection electrode RCE, driving electrodes TE1, sensing electrodes RE1, and a pressure sensing layer PSL.

The driving connection electrode TCE, the sensing connection electrode RCE, the driving electrodes TE1, and the sensing electrodes RE1 are disposed on the first substrate SUB1 facing the second substrate SUB2.

The driving connection electrode TCE is connected to the driving line TL and the driving electrode TE1. Specifically, the driving connection electrode TCE is connected to the driving line TL at one end in the longitudinal direction (y-axis direction). The driving electrodes TE1 may branch off in the width direction (x-axis direction) of the driving connection electrode TCE.

The sensing connection electrode RCE is connected to one of the sensing lines RL1 to RL8 and the sensing electrodes RE1. Specifically, the sensing connection electrode TCE is connected to one of the sensing lines RL1 to RL8 at one end in the longitudinal direction (y-axis direction). The sensing electrodes RE1 may branch off in the width direction (x-axis direction) of the sensing connection electrode RCE.

The driving electrodes TE1 and the sensing electrodes RE1 may be disposed on the same layer. The driving electrodes TE1 and the sensing electrodes RE1 may be made of the same material. For example, the driving electrodes TE1 and the sensing electrodes RE1 may include a conductive material such as silver (Ag) and copper (Cu). The driving electrodes TE1 and the sensing electrodes RE1 may be formed on the first substrate SUB1 by screen printing.

The driving electrodes TE1 and the sensing electrodes RE1 are disposed adjacent to each other but are not connected to each other. The driving electrodes TE1 and the sensing electrodes RE1 may be arranged in parallel with one another. The driving electrodes TE1 and the sensing electrodes RE1 may be alternately arranged in the longitudinal direction (y-axis direction) of the driving connection electrode TCE and the sensing connection electrode RCE. That is to say, the driving electrode TE1, the sensing electrode RE1, the driving electrode TE1 and the sensing electrode RE1 may be arranged repeatedly in this order in the longitudinal direction (y-axis direction) of the driving connection electrode TCE and the sensing connection electrode RCE.

The pressure sensing layer PSL is disposed on the surface of the second substrate SUB2 facing the first substrate SUB1. The pressure sensing layer PSL may be disposed such that it overlaps with the driving electrodes TE1 and the sensing electrodes RE1.

The pressure sensing layer PSL may include a pressure sensitive material and a polymer resin where the pressure sensitive material is disposed. The pressure sensitive material may be metal microparticles (or metal nanoparticles) such as nickel, aluminum, titanium, tin and copper. For example, the pressure sensing layer PSL may be a quantum tunneling composite (QTC).

When no pressure in the height direction (z-axis direction) of the second pressure sensor 512 is applied to the second substrate SUB2, there is a gap between the pressure sensing layer PSL and the driving electrode TE1 and between the pressure sensing layer PSL and the sensing electrodes RE1 as shown in FIG. 12. That is to say, when no pressure is applied to the second substrate SUB2, the pressure sensing layer PSL is spaced apart from the driving electrodes TE1 and the sensing electrodes RE1.

When a pressure is applied to the second substrate SUB2 in the height direction (z-axis direction) of the second pressure sensor 512, the pressure sensing layer PSL may come in contact with the driving electrodes TE1 and the sensing electrodes RE1. In this case, at least one of the driving electrodes TE1 and at least one of the sensing electrodes RE1 may be physically connected through the pressure sensing layer PSL, and the pressure sensing layer PSL may function as an electrical resistance.

According to the exemplary embodiment shown in FIGS. 11 and 12, the area in which the pressure sensing layer PSL comes in contact with the driving electrodes TE1 and with the sensing electrodes RE1 depending on the pressure applied to the second pressure sensor 512, such that the resistance value of the sensing line electrically connected to the sensing electrodes RE1. For example, as shown in FIG. 12, the higher the pressure applied to the pressure sensitive cells of the second pressure sensor 512 is, the lower the resistance value of the sensing line. The pressure sensing unit 330 senses a change in current value or a voltage value from the sensing lines RL1 to RL8, thereby sensing the pressure that the user presses by a finger.

Although the second pressure sensor 512 has been described above as an example, the first pressure sensor 511, the third pressure sensor 513, and the fourth pressure sensor 514 are substantially identical to the second pressure sensor 512 shown in FIGS. 11 and 12. Therefore, the first pressure sensor 511, the third pressure sensor 513, and the fourth pressure sensor 514 will not be described in detail.

FIG. 13 is a view showing an example of a display device in which pressure sensors are used as physical buttons according to an exemplary embodiment of the present invention.

FIG. 13 shows the first to eighth pressure sensitive cells CE1 to CE8 of the first pressure sensor 511 disposed on the first longer side LS1 of the display device 10 and the first to sixth pressure sensitive cells CE1 to CE6 disposed on the first shorter side SS1 of the display device 10.

The first pressure sensor 511 and the third pressure sensor 513 may be used for the display device 10 as physical buttons. Specifically, when a pressure is applied to the first to eighth pressure sensitive cells CE1 to CE8 of the first pressure sensor 511 formed on the first longer side LS1 of the display device 10 and to the first to sixth pressure sensitive cells CE1 to CE6 of the third pressure sensor 513 formed on the first shorter side SS1 of the display device 10, a predetermined application or operation can be performed.

For example, among the first to eighth pressure sensitive cells CE1 to CE8 of the first pressure sensor 511 formed on the first longer side LS1 of the display device 10, the first pressure sensitive cell CE1 and the second pressure sensitive cell CE2 may be utilized as volume-up buttons VB+ which the user presses to turn up the volume of the display device 10. The third pressure sensitive cell CE3 and the fourth pressure sensitive cell CE4 may be utilized as volume-down buttons VB− which the user presses to turn down the volume of the display device 10. The fifth pressure sensitive cell CE5, the sixth pressure sensitive cell CE6 and the seventh pressure sensitive cell CE7 may be utilized as power buttons PWB which the user presses to turn off the power.

When a pressure is sensed from the first pressure sensitive cell CE1 and the second pressure sensitive cell CE2 formed on the first longer side LS1 of the display device 10, the main processor 710 may control the speaker of the display device 10 so that the volume is turned up. In addition, when a pressure is sensed from the third pressure sensitive cell CE3 and the fourth pressure sensitive cell CE4 formed on the first longer side LS1 of the display device 10, the main processor 710 may control the speaker of the display device 10 so that the volume is turned up. In addition, when a pressure is sensed from the fifth pressure sensitive cell CE5 and the sixth pressure sensitive cell CE6 and the seventh pressure sensitive cell CE7 formed on the first longer side LS1 of the display device 10, the main processor 710 may control the display device 10 so that the screen is turned off or the screen on which a user can select the power off may be output. The eighth pressure sensitive cell CE8 formed on the first longer side LS1 of the display device 10 may be utilized as a squeezing sensing button SB. The squeezing pressure applied to the eighth pressure sensitive cell CE8 may be greater than the pressure applied to the first to seventh pressure sensitive cells CE1 to CE7. When a squeezing pressure is sensed from the eighth pressure sensitive cell CE8 on each of the left curved portion and the right curved portion, the main processor 710 may control so that a predetermined application or operation is performed. For example, when a squeezing pressure is sensed from the eighth pressure sensitive cell CE8 formed on the first longer side LS1 of the display device 10, the main processor 710 may control the display device 10 so that it is turned on from the sleep mode.

In addition, among the first to sixth pressure sensitive cells CE1 to CE6 formed on the first shorter side SS1 of the display device 10, the first pressure sensitive cell CE1 and the second pressure sensitive cell CE2 may be utilized as a call button CB which the user presses to run a phone application on the display device 10. The third pressure sensitive cell CE3 and the fourth pressure sensitive cell CE4 may be utilized as a camera button CMB, which the user presses to run a camera application. The fifth pressure sensitive cell CE5 and the sixth pressure sensitive cell CE6 may be utilized as an Internet button, which the user presses to run an Internet application.

When a pressure is sensed from the first pressure sensitive cell CE1 and the second pressure sensitive cell CE2 formed on the first shorter side SS1 of the display device 10, the main processor 710 may control the display device 10 so that a phone application is run. In addition, when a pressure is sensed from the third pressure sensitive cell CE3 and the fourth pressure sensitive cell CE4 formed on the first shorter side SS1 of the display device 10, the main processor 710 may control the display device 10 so that a camera application is run. When a pressure is sensed from the fifth pressure sensitive cell CE5 and the sixth pressure sensitive cell CE6 formed on the first shorter side SS1 of the display device 10, the main processor 710 may control the display device 10 so that an Internet application is run.

It is to be understood that the exemplary embodiment shown in FIG. 13 is merely one example, and thus the inventive concepts are not limited thereto. Specifically, as a pressure is applied to the first to eighth pressure sensitive cells CE1 to CE8 of the first pressure sensor 511 located on the first longer side LS1 of the display device 10 and to the first to sixth pressure sensitive cells CE1 to CE6 of the third pressure sensor 513 located on the first shorter side SS1 of the display device 10, a variety of functions, including the above-described functions or other functions, can be performed. Although not shown in the drawings, each of the first to eighth pressure sensitive cells CE1 to CE8 of the second pressure sensor 512 located on the second longer side and the first to sixth pressure sensitive cells CE1 to CE8 of the fourth pressure sensor located on the second shorter side may allow a variety of functions to be executed.

Figure 15A:
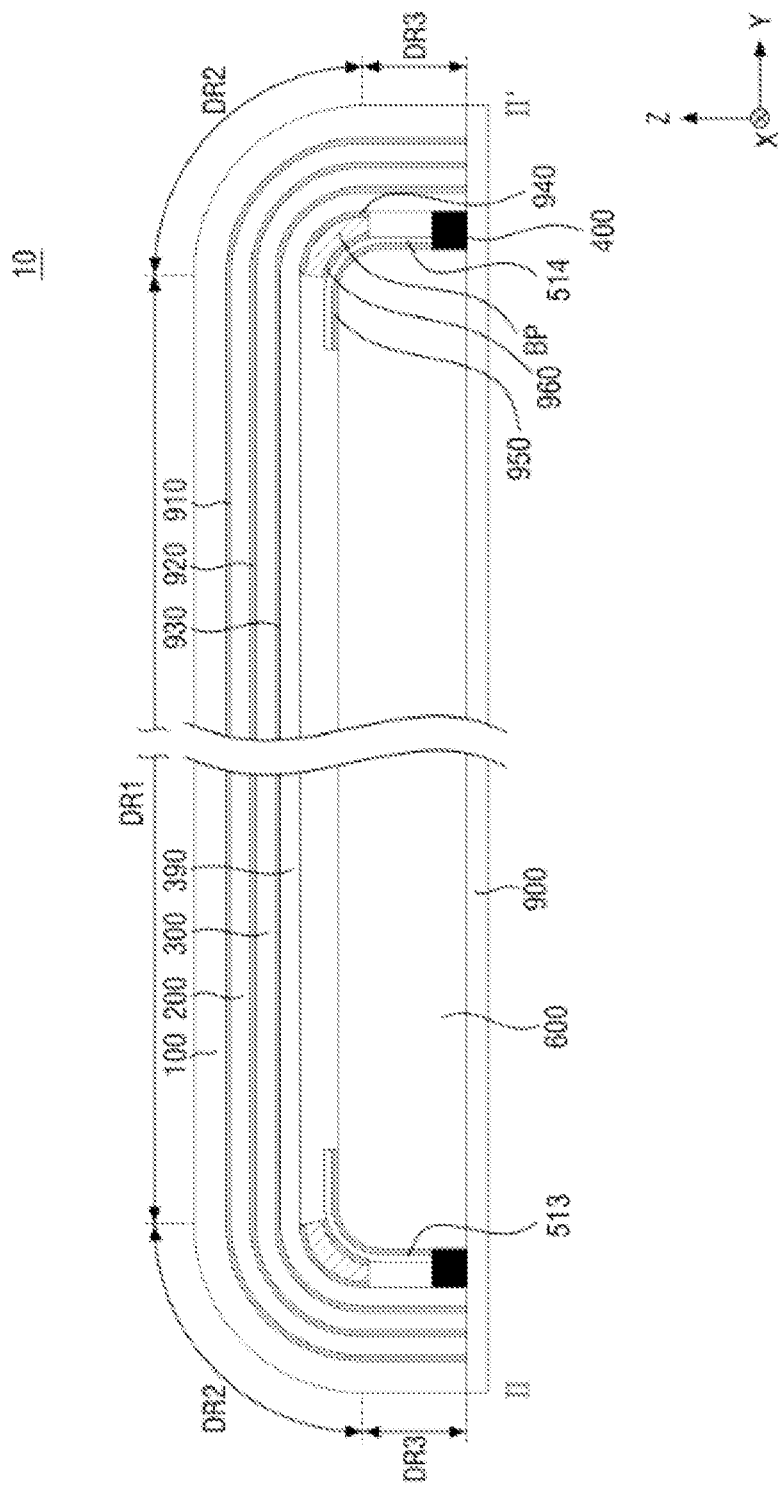
FIG. 15A, FIG. 15B, and FIG. 15C are cross-sectional views showing examples of display devices, taken along line II-II' of FIG. 1.
Figure 15B:
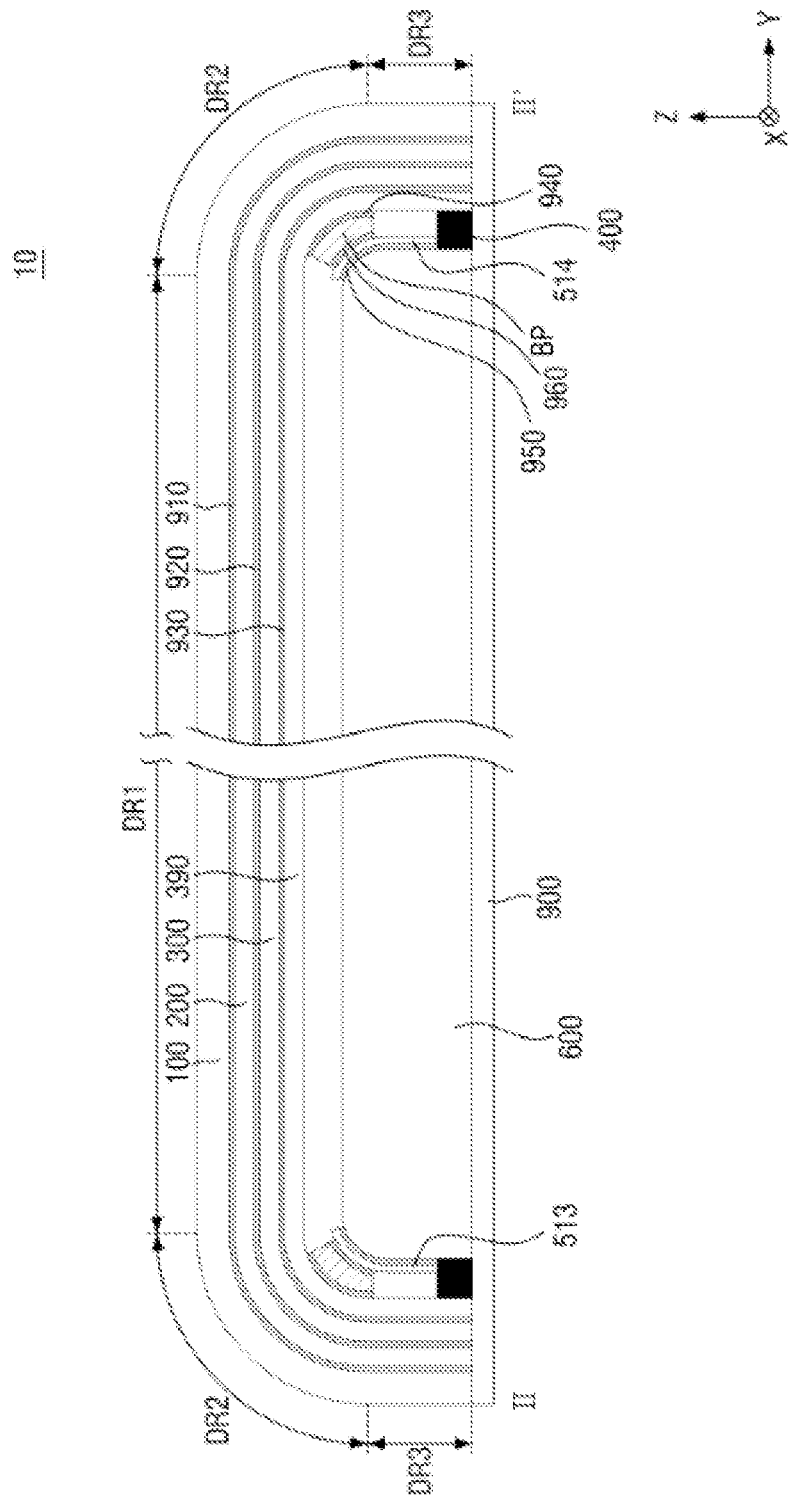
Figure 15C:
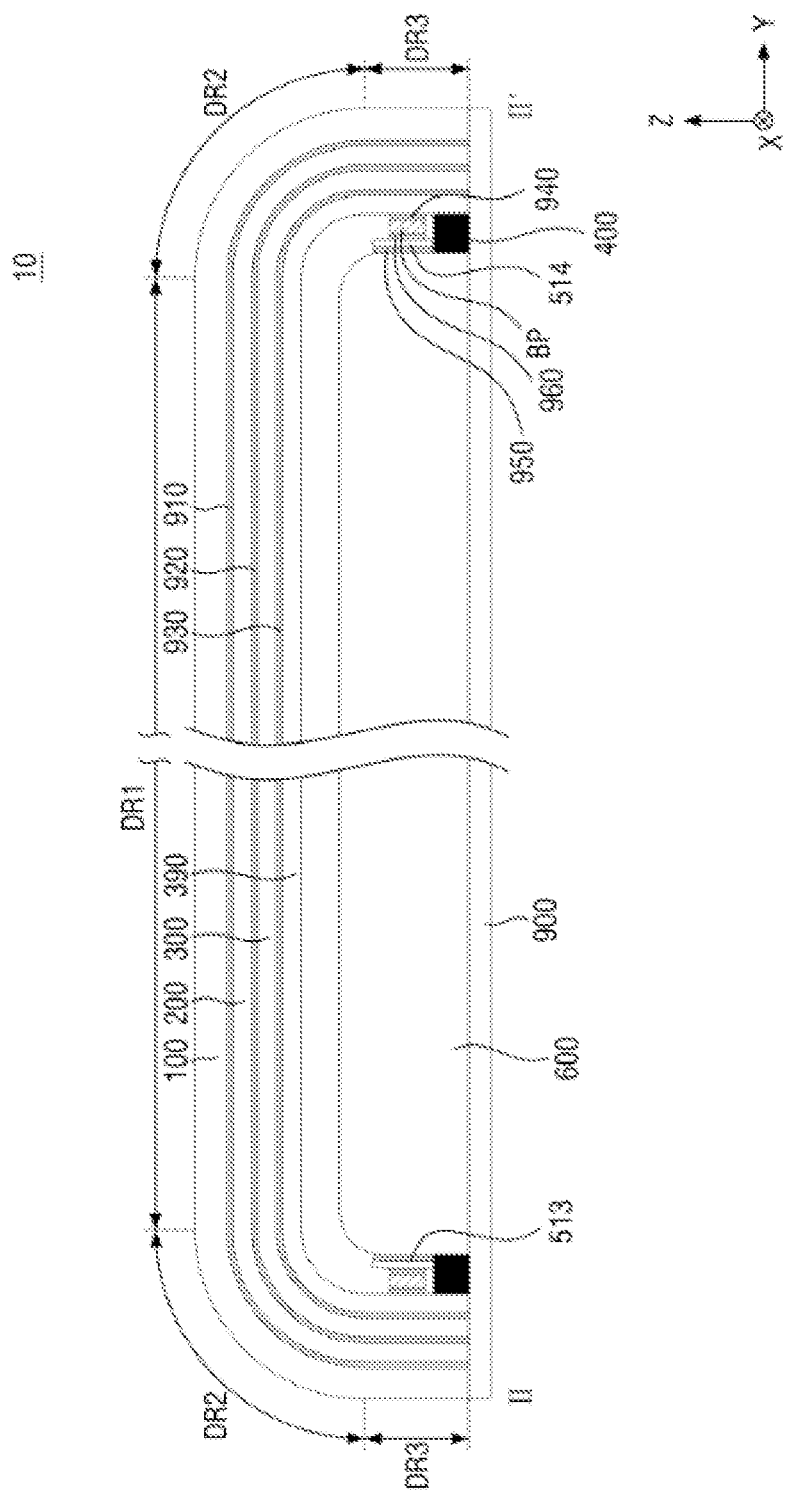
Figure 16:
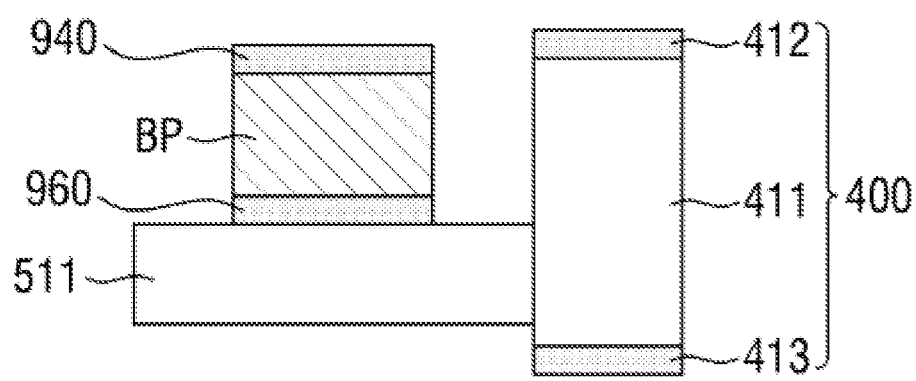
FIG. 16 is a cross-sectional view of an example of a first pressure sensor, a bump and a waterproof member.

FIGS. 14A to 14C are cross-sectional views showing examples of display devices, taken along line I-I' of FIG. 1. FIGS. 15A to 15C are cross-sectional views showing examples of display devices, taken along line II-II' of FIG. 1. FIG. 16 is a cross-sectional view of an example of a first pressure sensor, a bump, and a waterproof member.

Referring to FIGS. 14A to 14C and 16, a display device 10 may include a cover window 100, a touch sensing device 200, a display panel 300, a panel support member 390, a middle frame 600, and a bottom cover 900.

In an exemplary embodiment, the cover window 100, the touch sensing device 200, the display panel 300, the panel support member 390 and the middle frame 600 may be flat in the first region DR1, may be curved in the second regions DR2, and may be flat in the third regions DR3. For example, the cover window 100, the touch sensing device 200, the display panel 300, the panel support member 390 and the middle frame 600 may be flat in the first region DR1 in the first direction (x-axis direction), may be flat in the third regions DR3 in the third direction (z-axis direction), and may be curved in the second regions DR2 to connect the first region DR1 and the second regions DR2. That is to say, each of the cover window 100, the touch sensing device 200, the display panel 300, the panel support member 390 and the middle frame 600 may be formed as a flat portion in the first region DR1 as the upper surface, may be formed as upper curved portions in the second regions DR2, and may be formed as vertical portions in the third regions DR3 as the side surfaces. It is, however, to be understood that this is merely illustrative.

According to an exemplary embodiment of the present invention, as shown in FIG. 14A, each of the first pressure sensor 511 and the second pressure sensor 512 may be disposed from the first region DR1 to the second regions DR2 and from the second regions DR2 to the third regions DR3 of the display device 10. It is, however, to be understood that the inventive concepts are not limited thereto. As shown in FIG. 14B, each of the first pressure sensor 511 and the second pressure sensor 512 may be disposed from the second regions DR2 and the third regions DR3. Alternatively, as shown in FIG. 14C, each of the first pressure sensor 511 and the second pressure sensor 512 may be disposed only in the third regions DR3. For example, when the width of the third regions DR3 of the display device is small, each of the first pressure sensor 511 and the second pressure sensor 512 may be disposed from the first region DR1 to the third regions DR3, or may be disposed from the second regions DR2 to the third regions DR3, or may be disposed only in the second regions DR2 in some implementations. When the width of the third regions DR3 is sufficiently large, each of the first pressure sensor 511 and the second pressure sensor 512 may be disposed only in the third regions DR3. In addition, one of the first pressure sensor 511 or the second pressure sensor 512 may be disposed at the edge of the first region DR1, the second regions DR2, and the third regions DR3, and the other may be disposed in the second regions DR2 and the third regions DR3.

Bumps BP may be disposed on the first pressure sensors 511. Each of the bumps BP may be disposed on the lower surface of the panel support member 390 via a fourth adhesive member 940 and may be attached to the upper surfaces of the first pressure sensor 511 and the second pressure sensor 512 via a sixth adhesive member 960. Further, each of the first pressure sensor 511 and the second pressure sensor 512 may be attached to the upper surface of the middle frame 600 via a fifth adhesive member 950. The fourth adhesive member 940, the fifth adhesive member 950, and the sixth adhesive member 960 may be pressure sensitive adhesives (PSA). Either the fourth adhesive member 940 or the fifth adhesive member 950 may be eliminated.

The waterproof member 400 may be disposed on the outer side of each of the first pressure sensor 511 and the second pressure sensor 512. In other words, the waterproof member 400 may be disposed on one side of each of the first pressure sensor 511 and the second pressure sensor 512.

The waterproof member 400 may be attached to the lower surface of the panel support member 390 and the side surface of the middle frame 600. To this end, as shown in FIG. 16, the waterproof member 400 may include a base film 411, a first adhesive layer 412 disposed on a surface of the base film 411, and a second adhesive layer 413 disposed on the other surface of the base film 411. The base film 411 may be a polyethylene terephthalate (PET), a polyethyleneterephthalate (PET) and a cushion layer, or a polyethylene foam (PE-foam). The first adhesive layer 412 and the second adhesive layer 413 may be pressure sensitive adhesive (PSA). The first adhesive layer 412 may be adhered to the lower surface of the panel support member 390, and the second adhesive layer 413 may be adhered to the side surface of the middle frame 600. The side surface of the middle frame 600 may be defined as a flat surface in the third direction (z-axis direction) in the third region DR3.

The side surfaces of each of the cover window 100, the touch sensing device 200, the display panel 300, and the panel support member 390 may be disposed on the upper surface of the bottom cover 900. For example, the side surfaces of each of the cover window 100, the touch sensing device 200, the display panel 300, and the panel support member 390 may be attached and fixed to the upper surface of the bottom cover 900 via an adhesive material or a connection member. With this configuration, images can be displayed in each of the first region DR1, the second regions DR2, and the third regions DR3 of the display device 10, and the pressure sensors can be utilized at the edges of the first region DR1, in the second regions DR2, and in the third regions DR3. The waterproof member 400 is disposed on the outer side of each of the first pressure sensor 511 and the second pressure sensor 512 and attaches the lower surface of the panel support member 390 to the side surface of the middle frame 600. Accordingly, it is possible to prevent moisture and dust from permeating between the display panel 300 and the middle frame 600 by the waterproof member 400.

The examples shown in FIGS. 15A to 15C are substantially identical to the example shown in FIGS. 14A to 14C except that a third pressure sensor and a fourth pressure sensor are disposed; and, therefore, the redundant description will be omitted.

Figure 17:
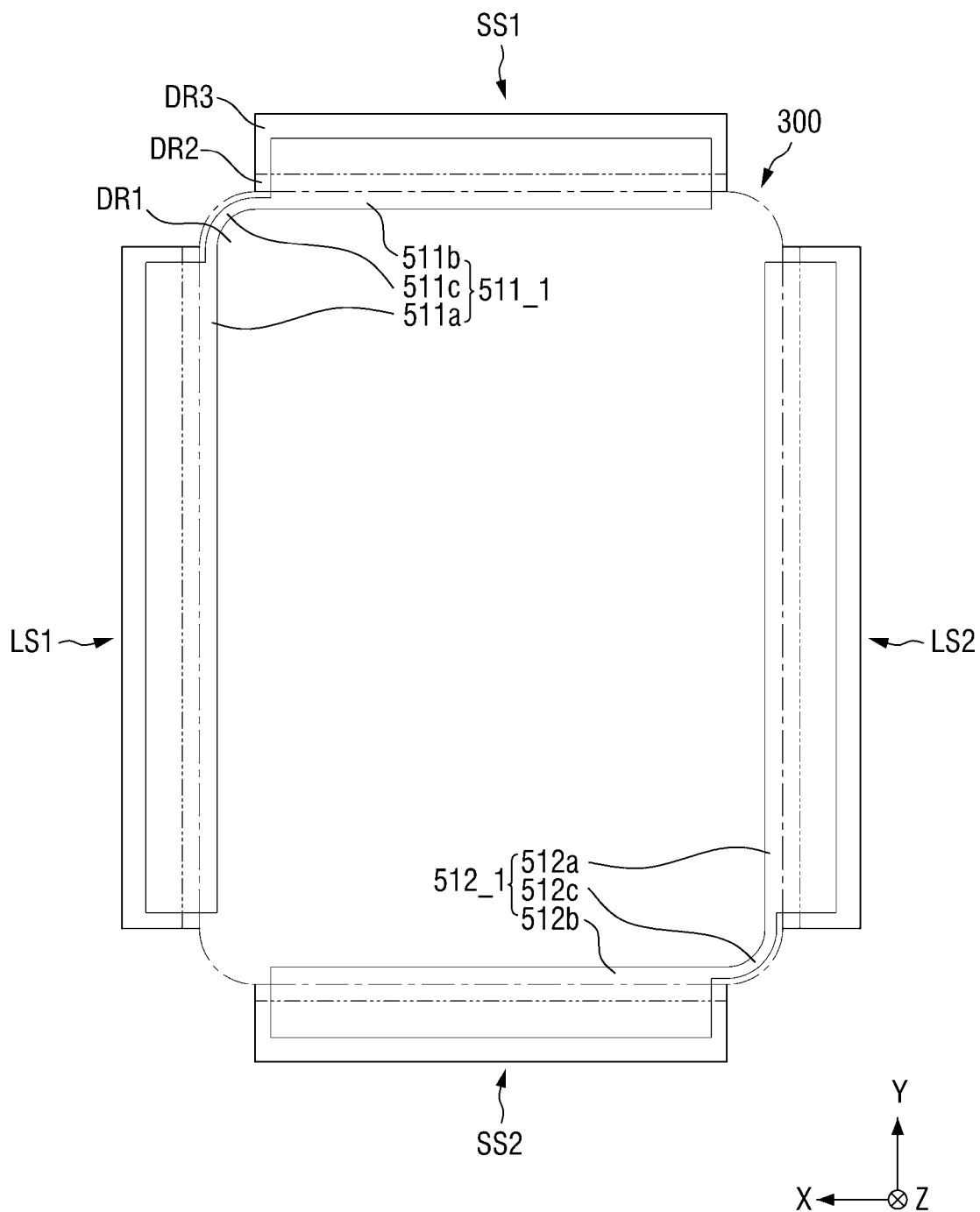
FIG. 17 is a bottom view showing pressure sensors disposed in the display panel according to another exemplary embodiment of the present invention.
Figure 18:
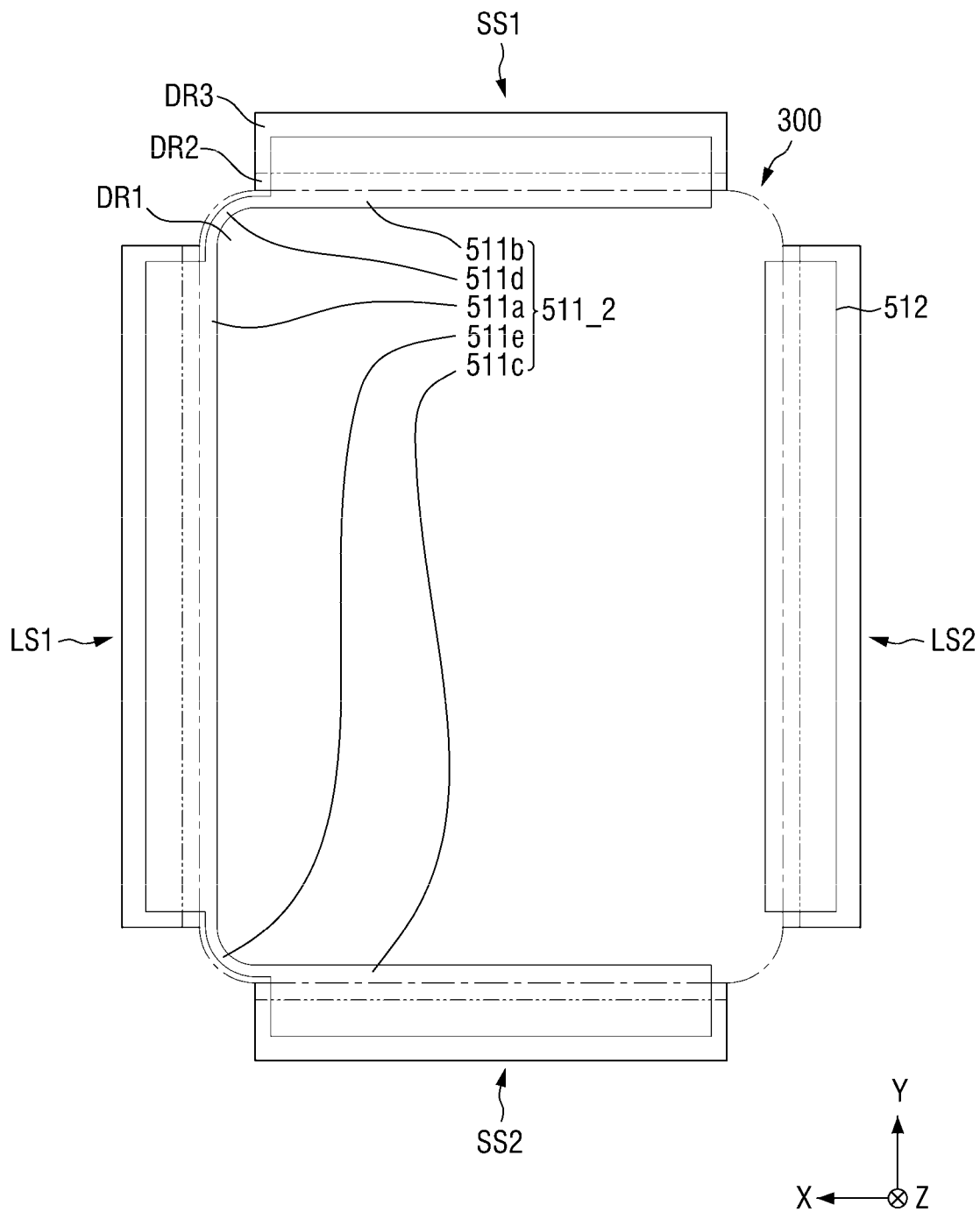
FIG. 18 is a bottom view showing pressure sensors disposed in the display panel according to another exemplary embodiment of the present invention.

FIG. 17 is a bottom view showing pressure sensors disposed in the display panel according to another exemplary embodiment of the present disclosure. FIG. 18 is a bottom view showing pressure sensors disposed in the display panel according to another exemplary embodiment of the present disclosure. The examples shown in FIGS. 17 and 18 are substantially identical to the example shown in FIG. 6 except that the shape and positions of a first pressure sensor and a second pressure sensor are different; and, therefore, the redundant description will be omitted.

Referring to FIG. 17, pressure sensors 511_1 and 512_1 according to an exemplary embodiment of the present invention may include a first pressure sensor 511_1 and a second pressure sensor 512_1. The first pressure sensor 511_1 may include a first sensor part 511a, a second sensor part 511b, and a connection part 511c. A first sensor part 511a may be disposed adjacent to the first longer side LS1 under the display panel 300 and may be extended in the second direction (y-axis direction). The second sensor part 511b may be disposed adjacent to the first shorter side SS1 under the display panel 300 and may be extended the first direction (x-axis direction). The connection part 511c may connect the first sensor part 511a with the second sensor part 511b. The connection part 511c may be disposed at the corner between the first shorter side SS1 and the first longer side LS1, may be thinner than the first sensor part 511a and the second sensor part 511b, and may be disposed along the corner between the first shorter side SS1 and the first longer side LS1. It is, however, to be understood that the present disclosure is not limited thereto. The first sensor part 511a may be connected to the second sensor part 511b in a variety of ways.

The second pressure sensor 512_1 may include a first sensor part 512a, a second sensor part 512b, and a connection part 512c. The first sensor part 512a may be disposed adjacent to the second longer side LS2 under the display panel 300 and may be extended in the second direction (y-axis direction). The second sensor part 512b may be disposed adjacent to the second shorter side SS2 under the display panel 300 and may be extended the first direction (x-axis direction). The connection part 512c may connect the first sensor part 512a with the second sensor part 512b. The connection part 512c may be disposed at the corner between the second shorter side SS2 and the second longer side LS2, may be thinner than the first sensor part 512a and the second sensor part 511b, and may be disposed along the corner between the second shorter side SS2 and the second longer side LS2. It is, however, to be understood that the inventive concepts are not limited thereto. The first sensor part 512a may be connected to the second sensor part 512b in a variety of ways.

The arrangement of the first pressure sensor and the second pressure sensor is not limited thereto. For example, the first sensor part 511a of the first pressure sensor 511_1 may be disposed adjacent to the first longer side LS1 under the display panel 300 and may be extended in the second direction (y-axis direction). The second sensor part 511b may be disposed adjacent to the second shorter side SS2 under the display panel 300 and may be extended the first direction (x-axis direction). The connection part 511c may be disposed at the corner between the second shorter side SS2 and the first longer side LS1. The first sensor part 512a of the second pressure sensor 512_1 may be disposed adjacent to the second longer side LS2 under the display panel 300 and may be extended in the second direction (y-axis direction). The second sensor part 511b may be disposed adjacent to the second shorter side SS2 under the display panel 300 and may be extended the first direction (x-axis direction). The connection part 511c may be disposed at the corner between the first shorter side SS1 and the second longer side LS2.

Referring to FIG. 18, pressure sensors 511_2 and 512 according to an exemplary embodiment of the present invention may include a first pressure sensor 511_2 and a second pressure sensor 512. The first pressure sensor 511_2 may include a first sensor part 511a, a second sensor part 511b, a third sensor part 511d, a first connection part 511c, and a second connection part 511e.

The first sensor part 511a may be disposed adjacent to the first longer side LS1 under the display panel 300 and may be extended in the second direction (y-axis direction). The second sensor part 511b may be disposed adjacent to the first shorter side SS1 under the display panel 300 and may be extended the first direction (x-axis direction). The third sensor part 511d may be disposed adjacent to the second shorter side SS2 under the display panel 300 and may be extended the first direction (x-axis direction).

The first connection part 511c connects the first sensor part 511a with the second sensor part 511b, and the second connection part 511e connects the first sensor part 511a with the third sensor part 511d.

The first connection part 511c may be disposed at the corner between the first shorter side SS1 and the first longer side LS1, may be thinner than the first sensor part 511a and the second sensor part 511b, and may be disposed along the corner between the first shorter side SS1 and the first longer side LS1. The second connection part 511e may be disposed at the corner between the second shorter side SS2 and the first longer side LS1, may be thinner than the first sensor part 511a and the third sensor part 511d, and may be disposed along the corner between the second shorter side SS2 and the first longer side LS1.

The second pressure sensor 512 may be disposed adjacent to the second longer side LS2 under the display panel 300 and may be extended in the second direction (y-axis direction). The sensor part 512b may be disposed adjacent to the second shorter side SS2 under the display panel 300 and may be extended in the first direction (x-axis direction).

The arrangement of the first pressure sensor and the second pressure sensor is not limited thereto. For example, the pressure sensors disposed on three sides of the first and second shorter sides SS1 and SS2 and the first and second longer sides LS1 and LS2 may be connected to one another, and the pressure sensor disposed on the other side of the four sides may be separately disposed.

Figure 19:
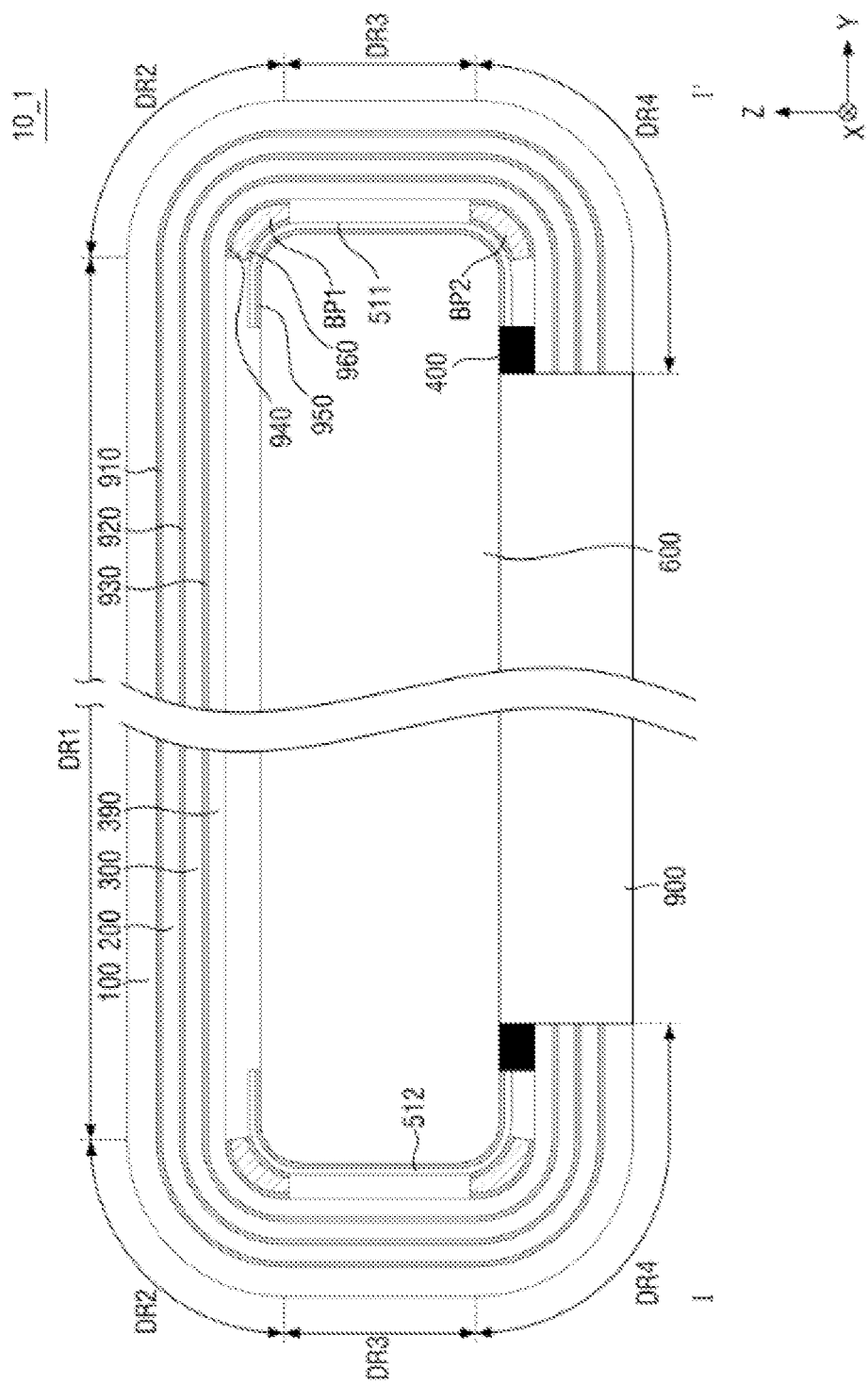
FIG. 19 is a cross-sectional view showing a display device according to another exemplary embodiment of the present invention, taken along line I-I' of FIG. 1.
Figure 20:
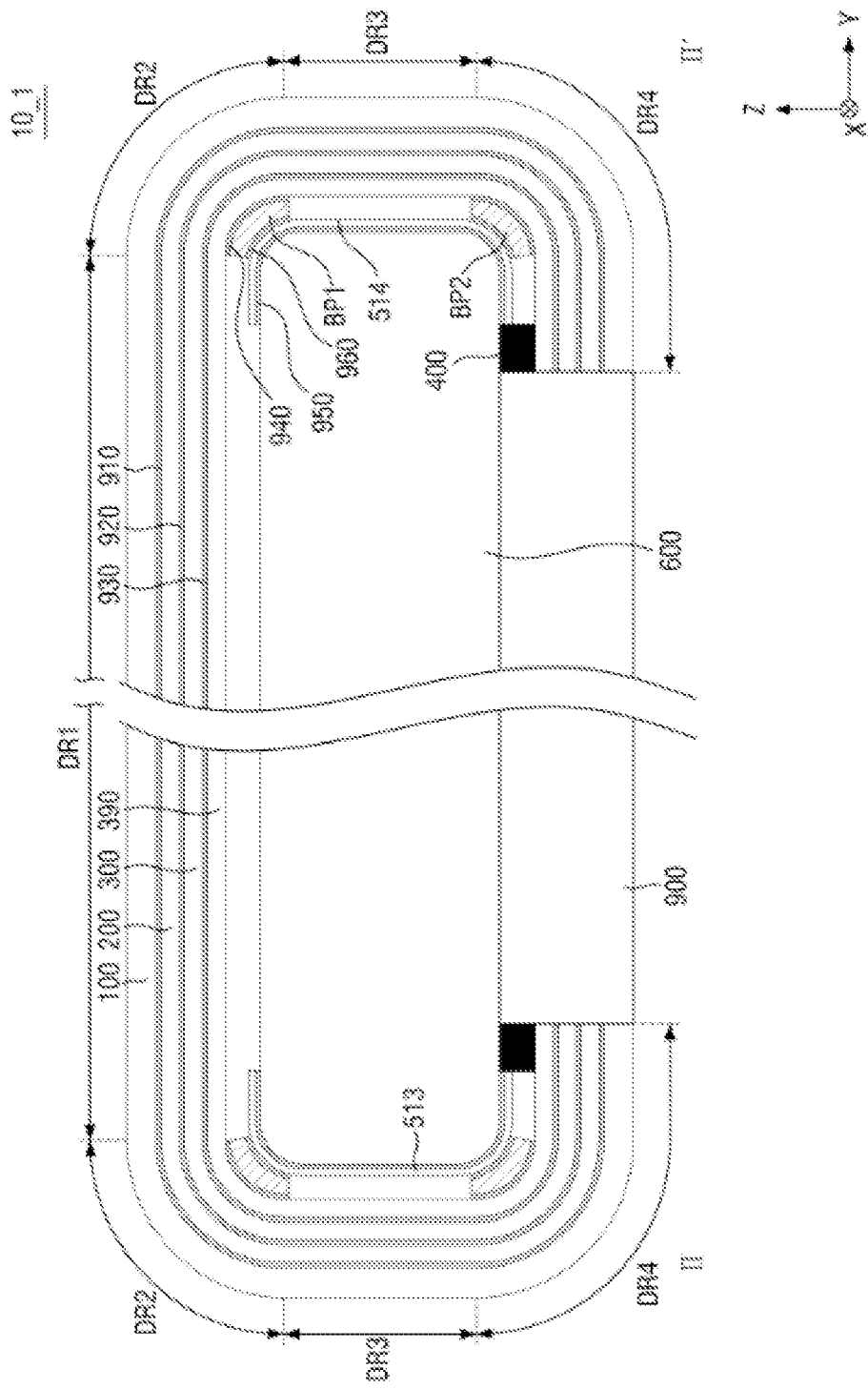
FIG. 20 is a cross-sectional view showing a display device according to another exemplary embodiment of the present invention, taken along line II-II' of FIG. 1.

FIG. 19 is a cross-sectional view showing a display device according to another exemplary embodiment of the present invention, taken along line I-I' of FIG. 1. FIG. 20 is a cross-sectional view showing a display device according to another exemplary embodiment of the present disclosure, taken along line II-II' of FIG. 1. The examples shown in FIGS. 19 and 20 are substantially identical to the example shown in FIGS. 14 and 15 except that the formers include fourth regions. Therefore, the redundant description will be omitted.

Referring to FIG. 19, a display device 10_1 may include a cover window 100, a touch sensing device 200, a display panel 300, a panel support member 390, a middle frame 600, and a bottom cover 900.

According to an exemplary embodiment of the present disclosure, the display device 10_1 may include a first region DR1, second regions DR2, third regions DR3, and fourth regions DR4 located on different planes, respectively. The first region DR1 is placed in a first plane. The second regions DR2 are connected to the first region DR1 and are bent or curved therefrom. The second regions DR2 may be placed in a second plane intersecting with the first plane at a predetermined angle or may have a curved surface. The second regions DR2 of the display device 10_1 are disposed in the vicinity of the first region DR1. The third regions DR3 are connected to the second regions DR2 and are bent or curved therefrom, respectively. The third regions DR3 may be located on a third plane intersecting with the second plane with a predetermined angle. The third plane may be a surface perpendicular to the first plane. The fourth regions DR4 are connected to the third regions DR3 and are bent or curved therefrom. The fourth regions DR4 may be located on the fourth plane intersecting with the third plane with a predetermined angle or may have a curved surface. The fourth regions DR4 may be extended to the lower surface of the display device 10_1. In this manner, the fourth regions DR4 are extended to the lower surface of the display device 10_1 so that images can be displayed even on the lower surface, and accordingly the display area can be effectively increased without increasing the size of the display device 10_1.

The fourth regions DR4 may be flat surfaces and curved surfaces extended from the third regions DR3 to the lower surface. For example, each of the fourth regions DR4 may include a curved surface extended from the respective third regions DR3 to the lower surface and a flat surface extended from the end of the curved surface. The curved surfaces of the fourth regions DR4 may be symmetrical to the curved surfaces of the second regions DR2, but the present disclosure is not limited thereto. The second regions DR2 and the fourth regions DR4 may be curved surfaces having different curvatures. In addition, the second regions DR2 may have a flat surface intersecting with the first region DR1 with a predetermined angle while the fourth regions DR4 may be curved surfaces. Alternatively, the second regions DR2 may be curved surfaces while the fourth regions DR4 may have a flat surface intersecting with the third regions DR3 with a predetermined angle.

The first region DR1 of the display device 10 is used as the main display surface. However, the second regions DR2, the third regions DR3 and the fourth regions DR4 as well as the first region DR1 may also be used as the display area of the display device 10_1. In the following description, the first region DR1 of the display device 10_1 is a flat portion, which is the upper surface of the display device 10, the second regions DR2 are upper curved portions, the third regions DR3 are vertical portions which are the side surfaces of the display device 10, and the fourth regions DR4 are lower curved portions, for example. It is, however, to be understood that the inventive concepts are not limited thereto.

In an exemplary embodiment, the cover window 100, the touch sensing device 200, the display panel 300, the panel support member 390 and the middle frame 600 of the display device 10_1 may be flat in the first region DR1, may be curved in the second regions DR2, may be flat in the third regions DR3, and may be curved in the fourth regions DR4. For example, each of the cover window 100, the touch sensing device 200, the display panel 300, the panel support member 390, and the middle frame 600 may be flat in the first region DR1 in the first direction (x-axis direction), may be flat in the third regions DR3 in the third direction (z-axis direction), may be curved in the second regions DR2 to connect the first region DR1 and the second regions DR2, and may be curved and extended from the third regions DR3 to the lower surface in the fourth regions DR4. That is to say, each of the cover window 100, the touch sensing device 200, the display panel 300, the panel support member 390, and the middle frame 600 may be formed as a flat portion in the first region DR1 as the upper surface, may be formed as upper curved portions in the second regions DR2, may be formed as vertical portions in the third regions DR3 as the side surfaces, and may be formed as lower curved portions in the fourth regions DR4. It is, however, to be understood that the inventive concepts are not limited thereto. Each of the cover window 100, the touch sensing device 200, the display panel 300, the panel support member 390, and the middle frame 600 may have a curved surface and a flat surface extended from the curved surface in the fourth regions DR4.

Each of the first pressure sensor 511 and the second pressure sensor 512 may be disposed from the first region DR1 to the fourth regions DR4 via the second regions DR2 and the third regions DR3 of the display device 10. It is, however, to be understood that the inventive concepts are not limited thereto. Each of the first pressure sensor 511 and the second pressure sensor 512 may be disposed from the second regions DR2 to the fourth regions DR4 via the third regions DR3, may be disposed from the third regions DR3 to the fourth regions DR4, may be disposed from the first region DR1 to the second regions DR2, and may be disposed in only one of the second regions DR2, the third regions DR3 and the fourth regions DR4. In addition, the first pressure sensor 511 and the second pressure sensor 512 may be disposed in different regions. For example, the first pressure sensor 511 may be disposed from the second regions DR2 to the fourth regions DR4 via the third regions DR3, while the second pressure sensor 512 may be disposed from the third regions DR3 to the fourth regions DR4.

In an exemplary embodiment, first bumps BP1 and second bumps BP2 may be disposed on each of the first pressure sensor 511 and the second pressure sensor 512. For example, on each of the first pressure sensor 511 and the second pressure sensor 512, the first bumps BP1 may be disposed in the side surface and the upper surface while the second bumps BP2 may be disposed in the side surface and the lower surface, which divided the area including the first region DR1, the second regions DR2, the third regions DR3 and the fourth regions DR4 into two sub-areas. Accordingly, the first bumps BP1 may not overlap with the second bumps BP2. It is, however, to be understood that the inventive concepts are not limited thereto. On each of the first pressure sensor 511 and the second pressure sensor 512, the area including the first region DR1, the second regions DR2, the third regions DR3 and the fourth regions DR4 may be divided into three sub-areas, so that three or more bumps may be disposed.

Each of the first bumps BP1 and the second bumps BP2 may be disposed on the lower surface of the panel support member 390 via a fourth adhesive member 940 and may be attached to the upper surfaces of the first pressure sensor 511 and the second pressure sensor 512 via a sixth adhesive member 960. Further, each of the first pressure sensor 511 and the second pressure sensor 512 may be attached to the upper surface, the side surface and the lower surface of the middle frame 600 via a fifth adhesive member 950. The fourth adhesive member 940, the fifth adhesive member 950 and the sixth adhesive member 960 may be pressure sensitive adhesives (PSA). Either the fourth adhesive member 940 or the fifth adhesive member 950 may be eliminated.

According to an exemplary embodiment of the present invention, the waterproof member 400 may be disposed on the outer side of each of the first pressure sensor 511 and the second pressure sensor 512. In other words, the waterproof member 400 may be disposed on one side of each of the first pressure sensor 511 and the second pressure sensor 512. For example, the waterproof member 400 may be disposed between one side surface of each of the first pressure sensor 511 and the second pressure sensor 512 and the side surface of the bottom cover 900. It is, however, to be understood that the inventive concepts are not limited thereto. The position of the waterproof member 400 may vary depending on the shapes of the middle frame 600 and the bottom cover 900. In addition, one surface of the waterproof member 400 may be attached to the panel support member 390, and the other surface of the waterproof member 400 may be attached to the middle frame 600.

The side surface of each of the cover window 100, the touch sensing device 200, the display panel 300, and the panel support member 390 may be disposed on the side surface of the bottom cover 900. For example, the side surfaces of each of the cover window 100, the touch sensing device 200, the display panel 300, and the panel support member 390 may be attached and fixed to the side surface of the bottom cover 900 via an adhesive material or a connection member. With this configuration, images can be displayed in each of the first region DR1, the second regions DR2, the third regions DR3, and the fourth regions DR4 of the display device 10, and the pressure sensors can be utilized at the edges of the first region DR1, in the second regions DR2, in the third regions DR3, and in the fourth regions DR4. The waterproof member 400 is disposed on the outer side of each of the first pressure sensor 511 and the second pressure sensor 512 and attaches the panel support member 390 to the middle frame 600. Accordingly, it is possible to prevent moisture and dust from permeating between the display panel 300 and the middle frame 600 by the waterproof member 400.

The example shown in FIG. 20 is substantially identical to the example shown in FIG. 19 except that a third pressure sensor and a fourth pressure sensor are disposed. Therefore, the redundant description will be omitted.

Figure 21:
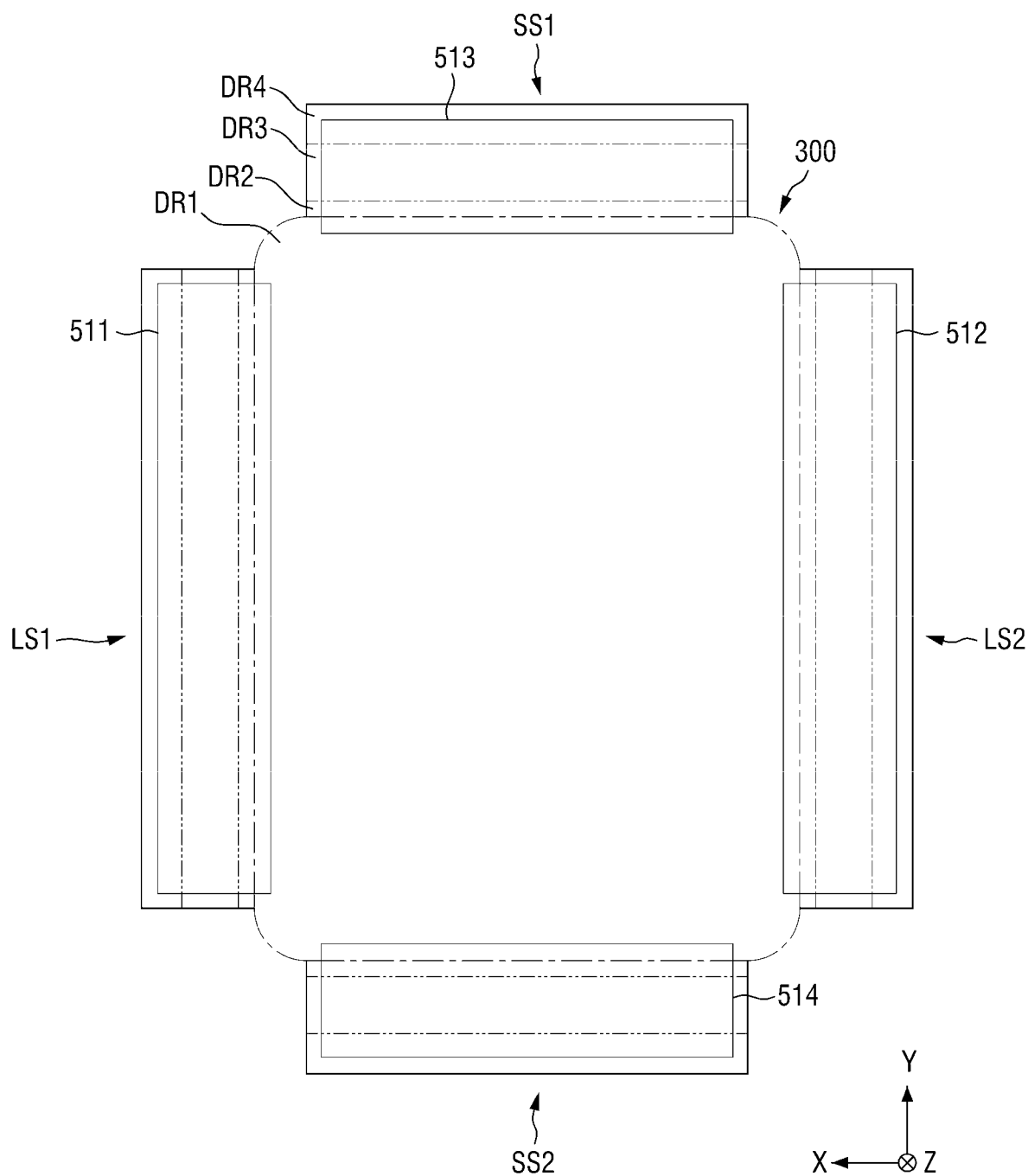
FIG. 21 is a bottom view showing pressure sensors disposed in the display panel according to another exemplary embodiment of the present invention.

FIG. 21 is a bottom view showing pressure sensors disposed in the display panel according to another exemplary embodiment of the present invention. The example shown in FIG. 21 is different from the example shown in FIG. 6 in that the display panel includes a fourth region and a pressure sensor is extended to the fourth region. Descriptions will be made focusing on differences, and the redundant description will be omitted.

Referring to FIG. 21, according to an exemplary embodiment of the present invention, a display panel 300 may include a first region DR1, a second region DR2, a third region DR3, and a fourth region DR4. For example, the second region DR2 may be extended toward one of the first and second shorter sides SS1 and SS2 and the first and second longer sides LS1 and LS2 from the first region DR1. The third region DR3 may be extended toward one of the first and second shorter sides SS1 and SS2 and the first and second longer sides LS1 and LS2 from the second region DR2. The fourth region DR4 may be extended toward one of the first and second shorter sides SS1 and SS2 and the first and second longer sides LS1 and LS2 from the second region DR2. It is, however, to be understood that the inventive concepts are not limited thereto. The second region DR2, the third region DR3, and the fourth region DR4 may be disposed such that they surround the first region DR1. Although the length of the longer side each of the second region DR2, the third region DR3, and the fourth region DR4 is shown as being less than the length of the side of the first region DR1, this is merely illustrative. The length of the longer side of each of the second region DR2, the third region DR3, and the fourth region extended from each side of the first region DR1 may be equal to the length of the side of the first region DR1.

The fourth region of the display panel 300 may be bent toward the lower surface of the display device from the third regions DR3 during the process of forming the display device 10_1. Accordingly, the display device 10_1 may display images even on the four edges of the lower surface as well as the upper surface and the four side surfaces.

Each of the first pressure sensor 511, the second pressure sensor 512, the third pressure sensor 513, and the fourth pressure sensor 514 may be disposed from the edge of the first region DR1 to the fourth region DR4 via the second region DR2 and the third region DR3. Each of the first pressure sensor 511, the second pressure sensor 512, the third pressure sensor 513, and the fourth pressure sensor 514 may be bent together with the display panel 300 during the process of forming the display device 10_1 and can be assembled. Accordingly, the first pressure sensor 511, the second pressure sensor 512, the third pressure sensor 513, and the fourth pressure sensor 514 can sense a pressure at the four edges of the upper surface, the four side surfaces, and the four edges of the lower surface of the display device 10_1.

Figure 22:
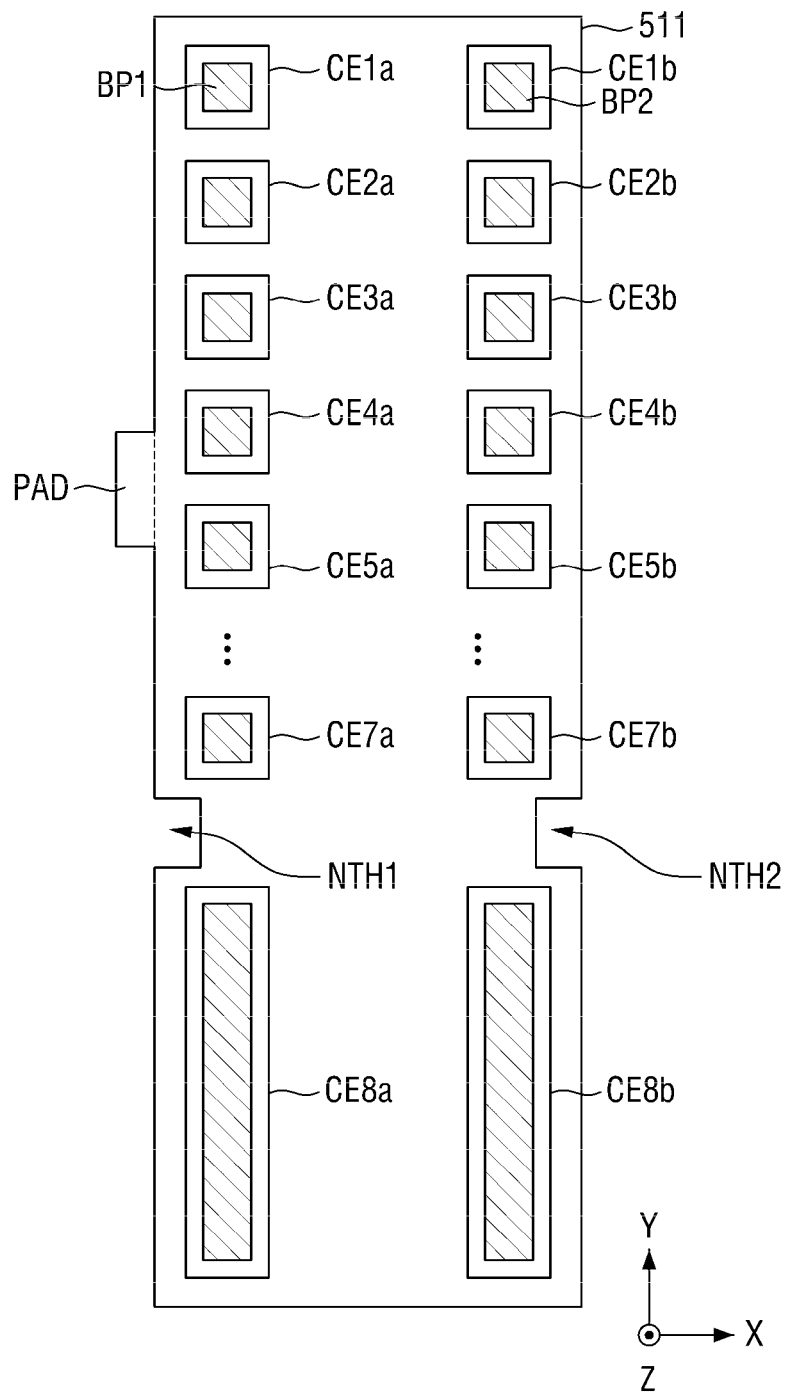
FIG. 22 is a plan view showing a first pressure sensor, first bumps and second bumps according to another exemplary embodiment of the present invention.
Figure 23:
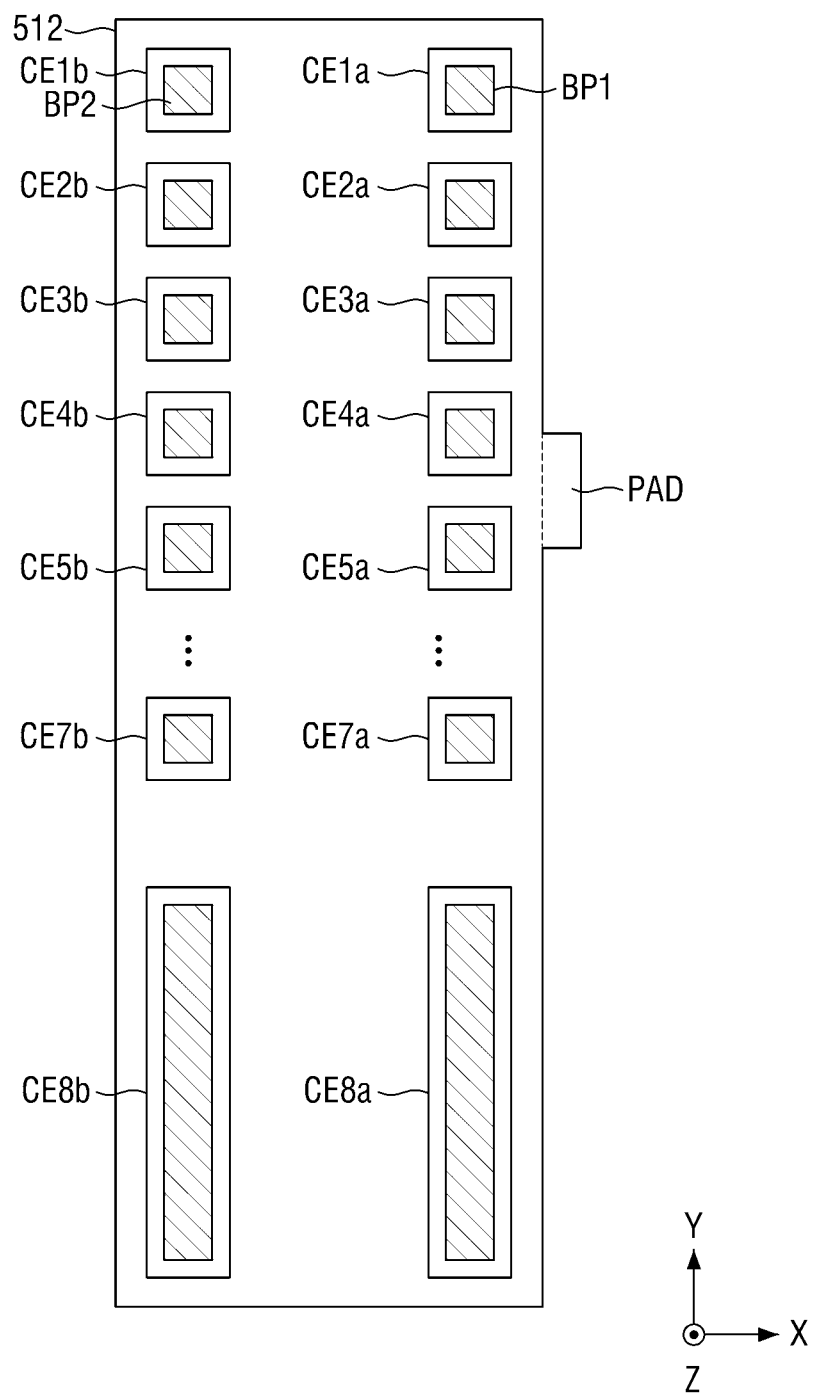
FIG. 23 is a plan view showing a second pressure sensor, first bumps, and second bumps according to another exemplary embodiment of the present invention.

FIG. 22 is a plan view showing a first pressure sensor, first bumps, and second bumps according to another exemplary embodiment of the present invention. FIG. 23 is a plan view showing a second pressure sensor, first bumps, and second bumps according to another exemplary embodiment of the present invention.

Referring to FIG. 22, the first pressure sensor 511 may have a rectangular shape having shorter sides in a first direction (x-axis direction) and longer sides in a second direction (y-axis direction) when viewed from the top. It is, however, to be understood that the inventive concepts are not limited thereto. The shape of the first pressure sensor 511 may vary depending on where it is disposed.

The first pressure sensor 511 according to the exemplary embodiment of the present invention includes pressure sensitive cells CE1a to CE8a and CE1b to CE8b arranged in a plurality of rows. For example, there may be the pressure sensitive cells CE1a to CE8a in the first row extended in the second direction (y-axis direction) adjacent to the pad area PAD, and pressure sensitive cells CE1b to CE8b in the second row spaced apart in the first direction (x-axis direction) from the pressure sensitive cells CE1a to CE8a in the first row. It is, however, to be understood that the inventive concepts are not limited thereto. The pressure sensitive cells may be arranged in three or more rows or may be arranged irregularly.

Although the eighth pressure sensitive cells CE1a to CE8a in the first row and the eighth pressure sensitive cells CE1b to CE8b in the second row are shown, the numbers of the pressure sensitive cells are not limited thereto. The numbers of the pressure sensitive cells CE1a to CE8a in the first row and the pressure sensitive cells CE1b to CE8b in the second row may vary.

Each of the pressure sensitive cells CE1a to CE8a in the first row and the pressure sensitive cells CE1b to CE8b in the second row may individually sense the pressure at the respective positions and may be disposed separately or continuously.

The first bumps BP1 may be disposed on the pressure sensitive cells CE1a to CE8a in the first row such that they overlap with the pressure sensitive cells CE1a to CE8a in the first row, respectively. The area including the first region DR1, the second region DR2, the third region DR3, and the fourth region DR4 may be divided into two sub-areas, and the first bumps BP1 may be located on the side surface and the upper surface. The second bumps BP2 may be disposed on the pressure sensitive cells CE1b to CE8b in the second row such that they overlap with the pressure sensitive cells CE1b to CE8b in the second row, respectively. The area including the first region DR1, the second region DR2, the third region DR3 and the fourth region DR4 may be divided into two sub-areas, and the second bumps BP2 may be located on the side surface and the upper surface.

In addition, in order not to cover the cable holes CAH of the middle frame 600, a first notch NTH1 and a second notch NTH2 may be formed at the portions of the first pressure sensor 511 that are in line with the cable holes CAH of the middle frame 600. It is, however, to be understood that the inventive concepts are not limited thereto. The middle frame 600 may not include the notches NTH1 and NTH2.

Each of the pressure sensitive cells CE1a to CE8a in the first row and the pressure sensitive cells CE1b to CE8b in the second row may be implemented as independent pressure sensors. For example, each of the pressure sensor in which the pressure sensitive cells CE1a to CE8a in the first row are arranged and the pressure sensor in which the pressure sensitive cells CE1b to CE8b in the second row are arranged may be independently formed, so that they may be disposed at the position where the first pressure sensor 511 is to be disposed.

The second pressure sensor 512, the first bumps BP1 and the second bumps BP2 shown in FIG. 23 are substantially identical to the first pressure sensor 511, the first bumps BP1 and the second bumps BP2 shown in FIG. 22 except that the second pressure sensor 512 does not include the first notch NTH1 and the NTH2. Accordingly, the second pressure sensor 512 and the first bumps BP1 and the second bumps BP2 shown in FIG. 23 will not be described in detail.

Figure 24:
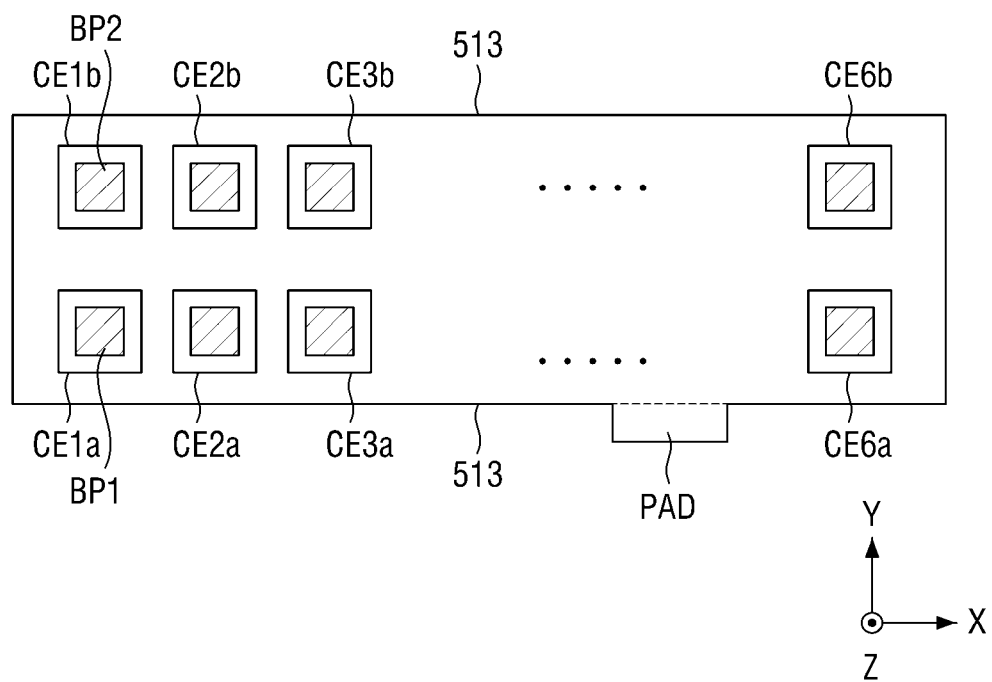
FIG. 24 is a plan view showing a third pressure sensor, first bumps BP1, and second bumps BP2 according to an exemplary embodiment of the present invention.
Figure 25:
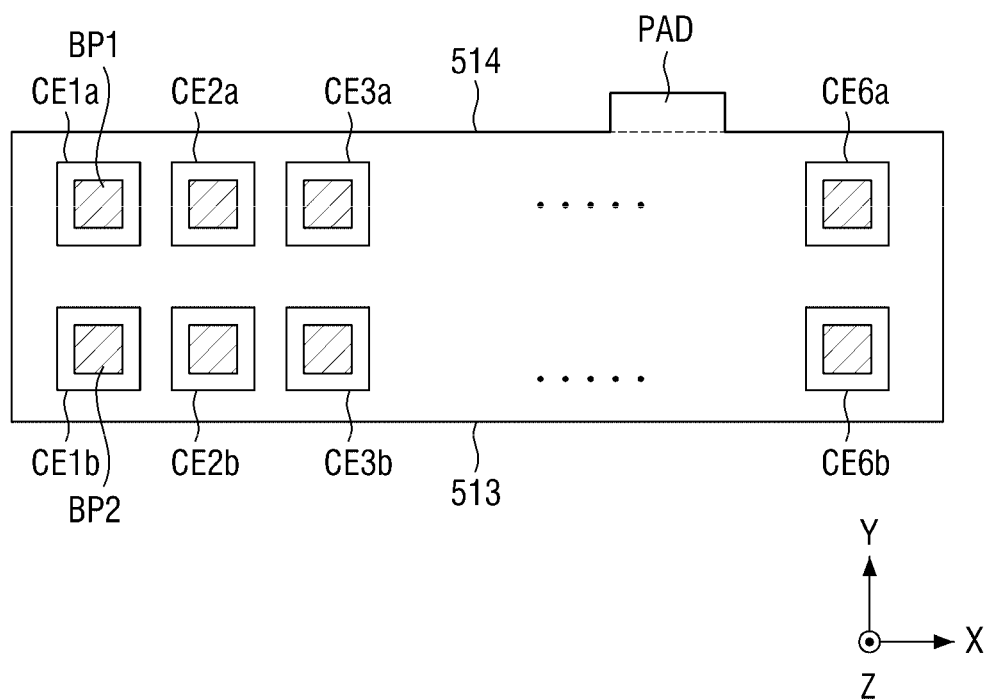
FIG. 25 is a plan view showing a fourth pressure sensor, first bumps BP1, and second bumps BP2 according to an exemplary embodiment of the present invention.

FIG. 24 is a plan view showing a third pressure sensor, first bumps BP1, and second bumps BP2 according to an exemplary embodiment of the present disclosure. FIG. 25 is a plan view showing a fourth pressure sensor, first bumps BP1, and second bumps BP2 according to an exemplary embodiment of the present invention.

Referring to FIG. 24, the third pressure sensor 513 may have a rectangular shape having shorter sides in the second direction (y-axis direction) and longer sides in the first direction (x-axis direction) when viewed from the top. It is, however, to be understood that the inventive concepts are not limited thereto. The shape of the third pressure sensor 513 may vary depending on where it is disposed. The third pressure sensor 513 may be shorter than the first pressure sensor 511. It is, however, to be understood that the present disclosure is not limited thereto. The length of the third pressure sensor 513 may be equal to the length of the first pressure sensor 511. In some implementations, the length of the third pressure sensor 513 may be equal to or greater than the length of the first pressure sensor 511.

The third pressure sensor 513 according to the exemplary embodiment of the present invention includes pressure sensitive cells CE1a to CE6a and CE1b to CE68b arranged in a plurality of rows. For example, there may be the pressure sensitive cells CE1a to CE6a in the first row extended in the first direction (x-axis direction) adjacent to the pad area PAD, and pressure sensitive cells CE1b to CE6b in the second row spaced apart in the second direction (y-axis direction) from the pressure sensitive cells CE1a to CE6a in the first row. It is, however, to be understood that the inventive concepts are not limited thereto. The pressure sensitive cells may be arranged in three or more rows or may be arranged irregularly.

Although the sixth pressure sensitive cells CE1a to CE6a in the first row and the sixth pressure sensitive cells CE1b to CE6b in the second row are shown, the numbers of the pressure sensitive cells are not limited thereto. The numbers of the pressure sensitive cells CE1a to CE6a in the first row and the pressure sensitive cells CE1b to CE6b in the second row may vary.

Each of the pressure sensitive cells CE1a to CE6a in the first row and the pressure sensitive cells CE1b to CE6b in the second row may individually sense the pressure at the respective positions and may be disposed separately or continuously.

The first bumps BP1 may be disposed on the pressure sensitive cells CE1a to CE6a in the first row such that they overlap with the pressure sensitive cells CE1a to CE6a in the first row, respectively. The area including the first region DR1, the second region DR2, the third region DR3, and the fourth region DR4 may be divided into two sub-areas, and the first bumps BP1 may be located on the side surface and the upper surface. The second bumps BP2 may be disposed on the pressure sensitive cells CE1b to CE6b in the second row such that they overlap with the pressure sensitive cells CE1b to CE6b in the second row, respectively. The area including the first region DR1, the second region DR2, the third region DR3, and the fourth region DR4 may be divided into two sub-areas, and the second bumps BP2 may be located on the side surface and the upper surface.

Each of the pressure sensitive cells CE1a to CE6a in the first row and the pressure sensitive cells CE1b to CE6b in the second row may be implemented as independent pressure sensors. For example, each of the pressure sensor in which the pressure sensitive cells CE1a to CE6a in the first row are arranged and the pressure sensor in which the pressure sensitive cells CE1b to CE6b in the second row are arranged may be independently formed, so that they may be disposed at the position where the third pressure sensor 513 is to be disposed.

Since the fourth pressure sensor 514, the first bumps BP1 and the second bumps BP2 shown in FIG. 25 are substantially identical to the third pressure sensor 513, the first bumps BP1 and the second bumps BP2, respectively; and, therefore, the redundant description will be omitted.

Figure 26:
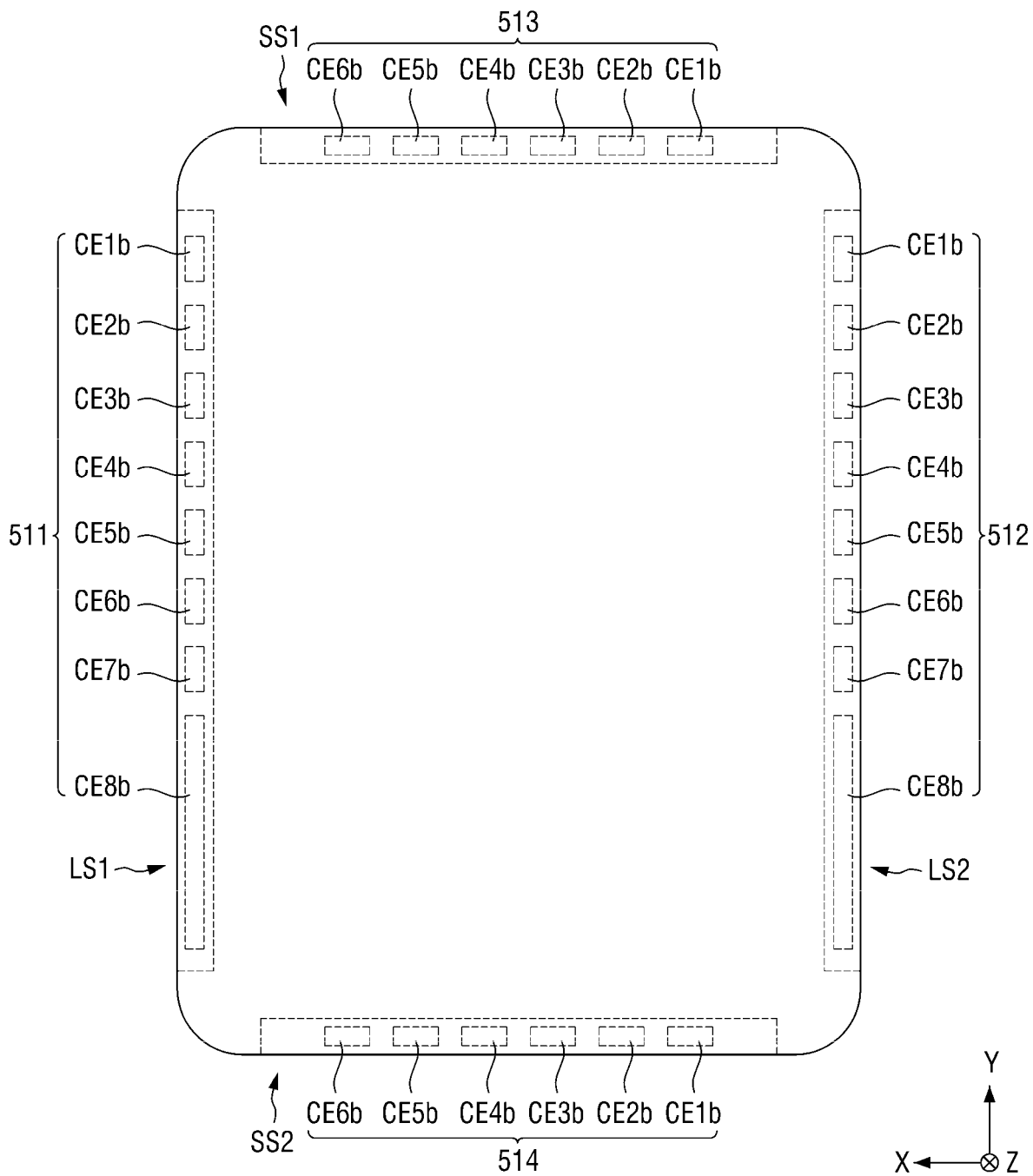
FIG. 26 is a bottom view of the pressure sensitive cells on the lower surface of the display device according to an exemplary embodiment of the present invention.

FIG. 26 is a bottom view of the pressure sensitive cells on the lower surface of the display device according to an exemplary embodiment of the present disclosure.

Referring to FIG. 26, in an exemplary embodiment, the pressure sensitive cells CE1b to CE8b and CE1b to CE6b in the second row may be disposed in the fourth region DR4 and located on the lower surface of the display device 10_1. For example, the pressure sensitive cells CE1b to CE8b and CE1b to CE6b in the second row may be disposed at the corners between the first and second shorter sides SS1 and SS2 and the first and second longer sides LS1 and LS2 of the lower surface of the display device 10_1. Specifically, the pressure sensitive cells CE1b to CE8b in the second row of the first pressure sensor 511 may be disposed at the edge on the first longer side LS1 of the lower surface of the display device 10_1. The second pressure sensitive cells CE1b to CE8b in the second row of the second pressure sensor 512 may be disposed at the edge on the second longer side LS2. The pressure sensitive cells CE1b to CE6b in the second row of the third pressure sensor 513 may be disposed at the edge on the first shorter side SS1. The pressure sensitive cells CE1b to CE6b in the second row of the fourth pressure sensor 514 may be disposed at the edge of the second shorter side SS1.

The first to fourth pressure sensors 511, 512, 513, and 514 are spaced apart from one another at the corners of the lower surface of the display device 10_1 in FIG. 26. It is, however, to be understood that the present disclosure is not limited thereto. In other implementations, the first to fourth pressure sensors 511, 512, 513 and 514 may be arranged such that they surround the edges of the lower surface of the display device 10_1. In this case, the pressure sensitive cells CE1b to CE8b and CE1b to CE6b in the second row of the first to fourth pressure sensors 511, 512, 513 and 514 may be disposed such that they surround the edges of the lower surface of the display device 10_1.

Figure 27:
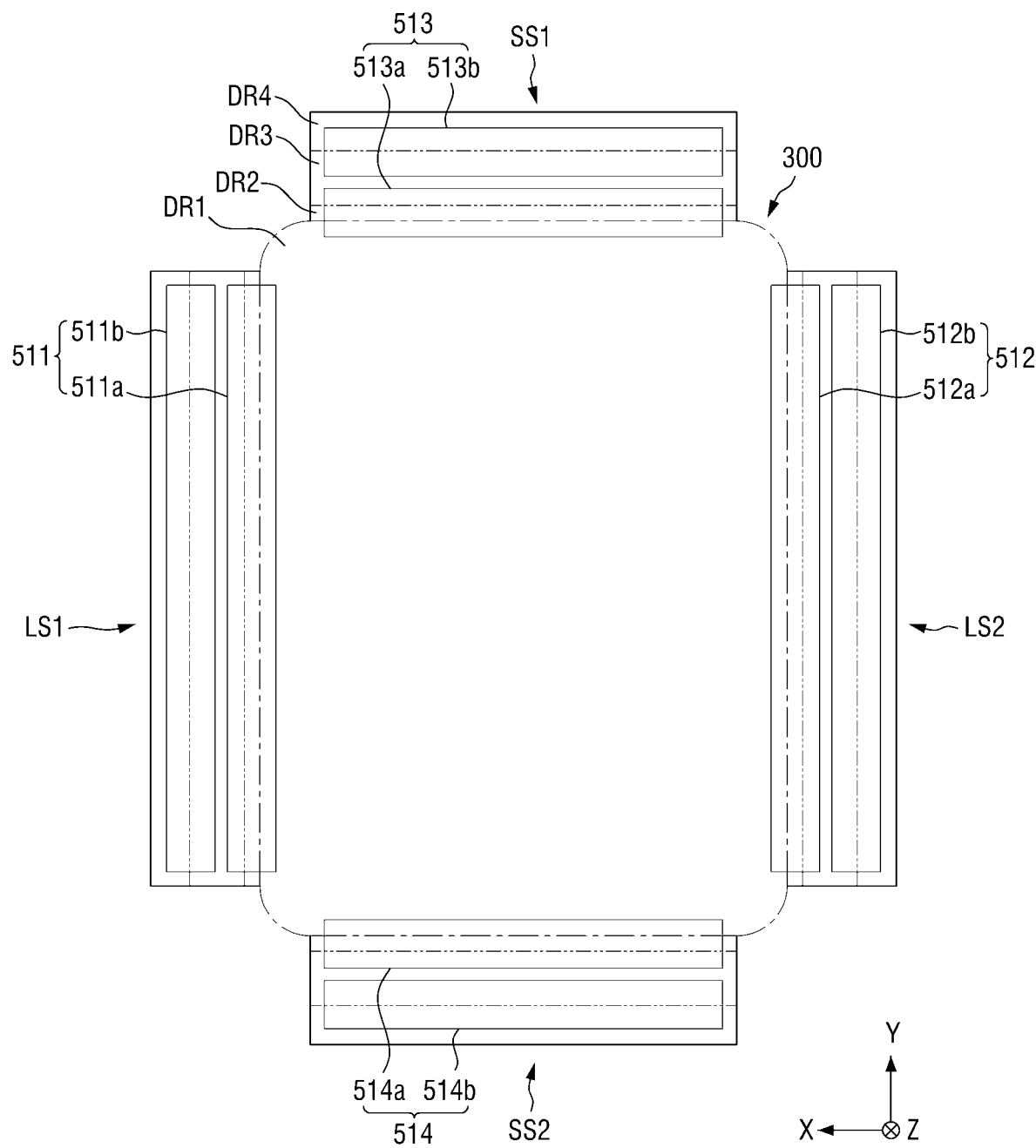
FIG. 27 is a bottom view showing pressure sensors disposed in the display panel according to another exemplary embodiment of the present invention.
Figure 28:
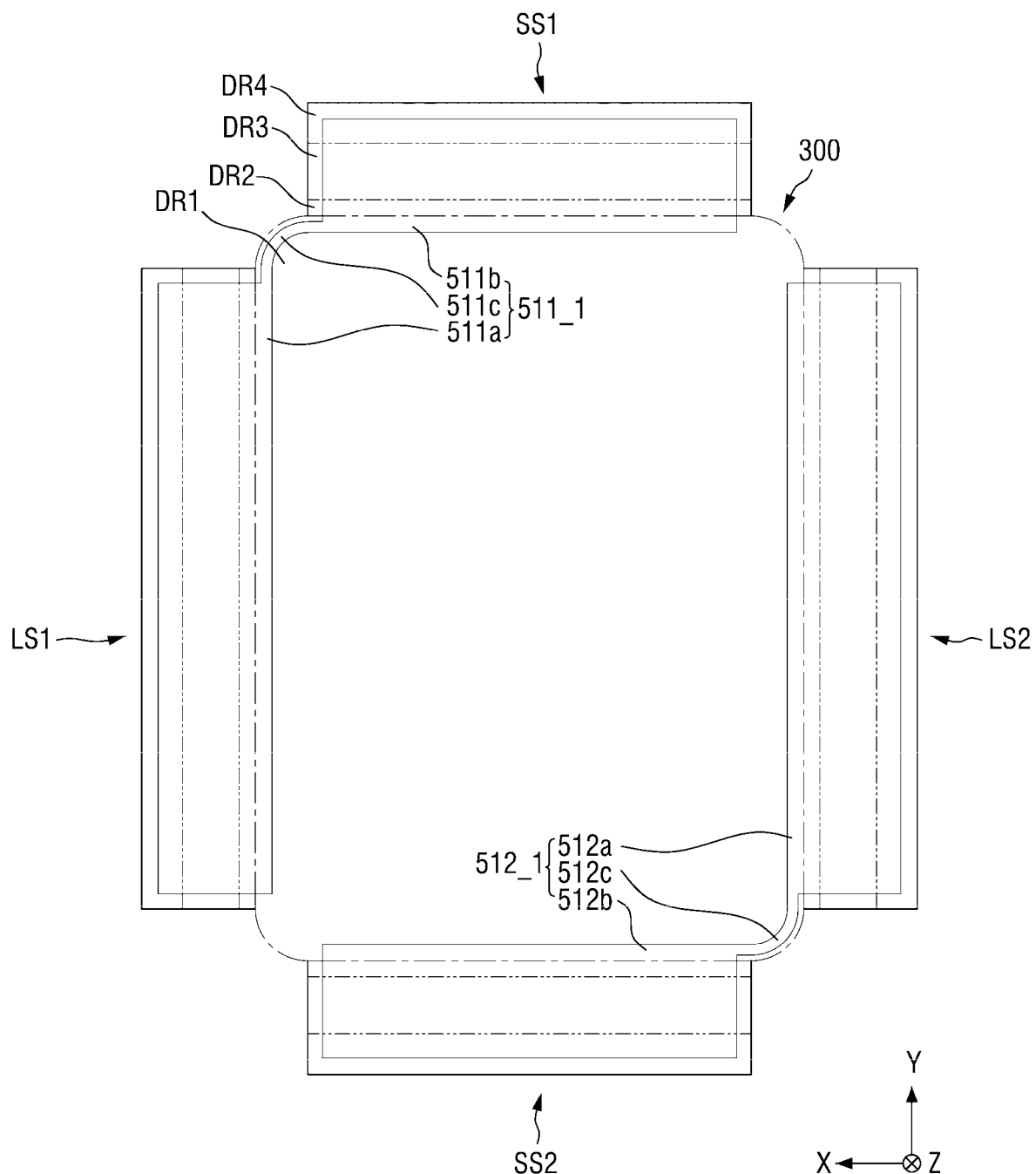
FIG. 28 is a bottom view showing pressure sensors disposed in the display panel according to another exemplary embodiment of the present invention.
Figure 29:
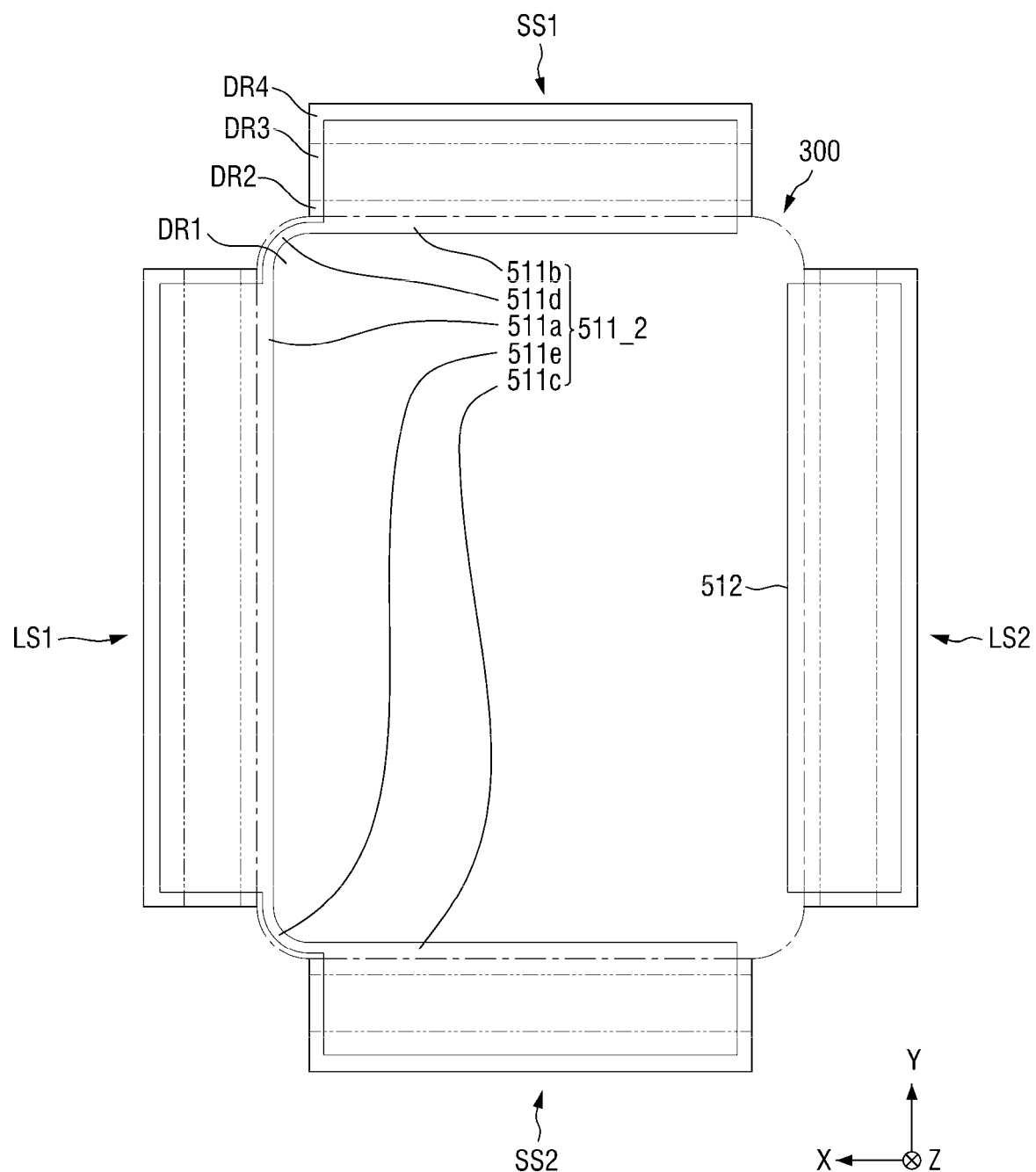
FIG. 29 is a bottom view showing pressure sensors disposed in the display panel according to another exemplary embodiment of the present invention.

FIG. 27 is a bottom view showing pressure sensors disposed in the display panel according to another exemplary embodiment of the present invention. FIG. 28 is a bottom view showing pressure sensors disposed in the display panel according to another exemplary embodiment of the present invention. FIG. 29 is a bottom view showing pressure sensors disposed in the display panel according to another exemplary embodiment of the present invention. The examples shown in FIGS. 27 and 29 are substantially identical to the example shown in FIG. 21 except that the shape and positions of pressure sensors are different; and, therefore, the redundant description will be omitted.

Referring to FIG. 27, each of the first to fourth pressure sensors 511, 512, 513, and 514 according to an exemplary embodiment of the present invention may include independent a first sensor part 511a; 512a; 513a; 514a and a second sensor part 511b; 512b; 513b; 514b. Referring to FIGS. 22 to 25, each of the first to fourth pressure sensors 511, 512, 513, and 514 may include a first sensor part 511a; 512a; 513a; 514a including pressure sensitive cells CE1a to CE8a and CE1a to CE6a in the first row, and a second sensor part 511b; 512b; 513b; 514b including the pressure sensitive cells CE1b to CE8b and CE1a to CE6a in the second row and separated from the first sensor part 511a; 512a; 513a; 514a.

Specifically, the first pressure sensor 511 may include a first sensor part 511a and s a second sensor part 511b located on the first longer side LS1. The first sensor part 511a is disposed on the side surface and the upper surface while the second sensor part 511b is disposed on the side surface and the lower surface, which divides the area including the first region DR1, the second region DR2, the third region DR3, and the fourth region DR4 into two sub-areas The second pressure sensor 512 may include a first sensor part 512a and a second sensor part 512b located on the second longer side LS2. The first sensor part 512a is disposed on the side surface and the upper surface while the second sensor part 512b is disposed on the side surface and the lower surface, which divides the area including the first region DR1, the second region DR2, the third region DR3, and the fourth region DR4 into two sub-areas.

The third pressure sensor 513 may include a first sensor part 513a and a second sensor part 513b located on the first shorter side SS1. The first sensor part 513a is disposed on the side surface and the upper surface while the second sensor part 513b is disposed on the side surface and the lower surface, which divides the area including the first region DR1, the second region DR2, the third region DR3, and the fourth region DR4 into two sub-areas.

The fourth pressure sensor 514 may include a first sensor part 514a and a second sensor part 514b located on the second shorter side SS2. The first sensor part 514a is disposed on the side surface and the upper surface while the second sensor part 514b is disposed on the side surface and the lower surface, which divides the area including the first region DR1, the second region DR2, the third region DR3, and the fourth region DR4 into two sub-areas.

Referring to FIG. 28, pressure sensors 511_1 and 512_1 according to an exemplary embodiment of the present invention may include a first pressure sensor 511_1 and a second pressure sensor 512_1. The first pressure sensor 511_1 may include a first sensor part 511a, a second sensor part 511b, and a connection part 511c. The second pressure sensor 512_1 may include a first sensor part 512a, a second sensor part 512b, and a connection part 512c. The example shown in FIG. 28 is different from the example shown in FIG. 27 in that a first sensor part 511a; 512a is connected to a second sensor part 511b; 512b by a connection part 511c; 512c as a single piece, and that each of the first sensor part 511a; 512a and the second sensor part 511b; 512b is disposed from the first region DR1 to the fourth region DR4 via the second region DR2 and the third region DR3 such that they are extended from the edge of the upper surface to the edge of the lower surface of the display device 10_1.

Referring to FIG. 29, pressure sensors 511_2 and 512 according to an exemplary embodiment of the present invention may include a first pressure sensor 511_2 and a second pressure sensor 512. The first pressure sensor 511_2 may include a first sensor part 511a, a second sensor part 511b, a third sensor part 511d, a first connection part 511c, and a second connection part 511e. Each of the first sensor part 511a, the second sensor part 511b, the third sensor part 511d and the second pressure sensor 512 may be disposed from the first region DR1 to the fourth region DR4 via the second region DR2 and the third region DR3 and may be extended from the edge of the upper surface to the edge of the lower surface of the display device 10_1. It is to be noted that the arrangement of the first pressure sensor 511_2 and the second pressure sensor 512 is not limited thereto. For example, the pressure sensors disposed on three sides of the first and second shorter sides SS1 and SS2 and the first and second longer sides LS1 and LS2 may be connected to one another, and the pressure sensor disposed on the other side of the four sides may be separately disposed.

Figure 30:
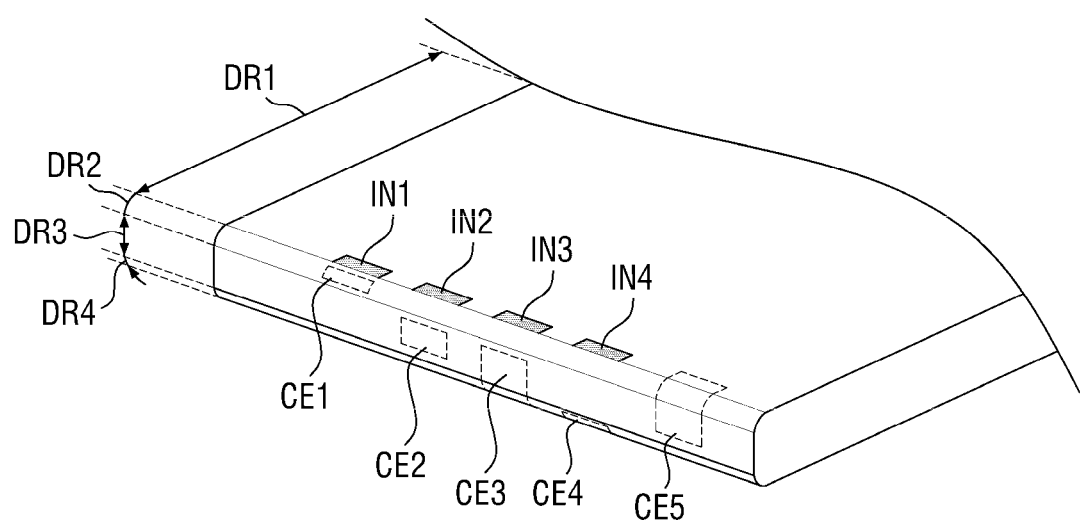
FIG. 30 and FIG. 31 are perspective views schematically showing the positions of the pressure sensitive cells and icon navigations for the pressure sensitive cells according to an exemplary embodiment of the present invention.
Figure 31:
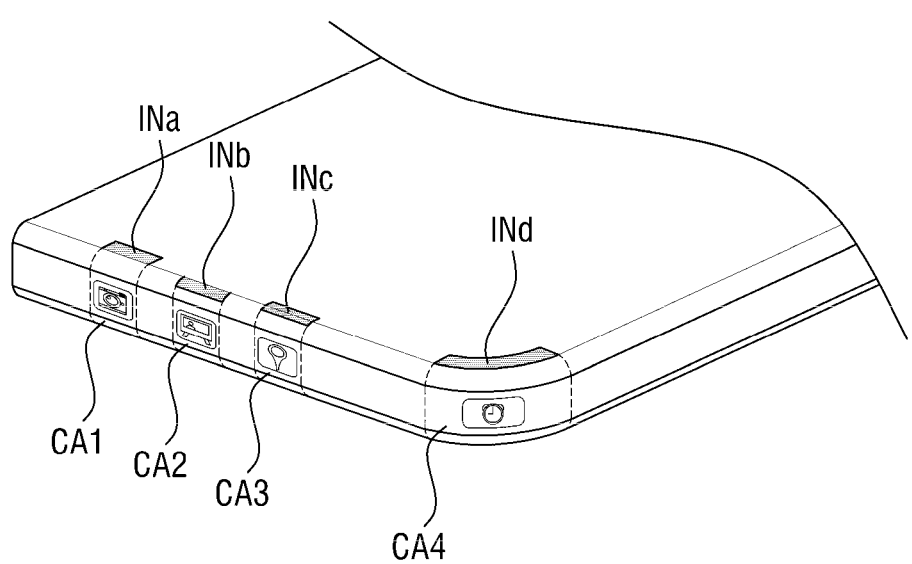

FIGS. 30 and 31 are perspective views schematically showing the positions of the pressure sensitive cells and icon navigations for the pressure sensitive cells according to an exemplary embodiment of the present invention.

Referring to FIG. 30, in an exemplary embodiment, a display device 10_1 may include first to fifth pressure sensitive cells CE1, CE2, CE3, CE4, and CE5. For example, the display device 10_1 may include a first pressure sensitive cell CE1 disposed in the second region DR2, a second pressure sensitive cell CE2 disposed in the third region DR3, a third pressure sensitive cell CE3 disposed from the third region DR3 to the fourth region DR4, a fourth pressure sensitive cell CE4 disposed in the fourth region DR4, and a fifth pressure sensitive cell CE5 disposed from the first region DR1 to the third region DR3 via the second region DR2. Icons corresponding to the first to fifth pressure sensitive cells CE1, CE2, CE3, CE4, and CE5, respectively, may be indicated on the display device 10_1.

Since the first to fourth pressure sensitive cells CE1, CE2, CE3, and CE4 are not disposed on the upper surface of the display device 10_1, it is necessary to guide the positions of the first to fourth pressure sensitive cells CE1, CE2, CE3, and CE4 on the front surface of the display device 10_1 for a user. Therefore, icon navigations IN1, IN2, IN3, and IN4 may be indicated on the edge of the upper surface of the display device 10_1 in line with the first to fourth pressure sensitive cells CE1, CE2, CE3, and CE4, respectively.

For example, a first icon navigation IN1 may be disposed at the edge of the first region DR1 in line with the first pressure sensitive cell CE1. A second icon navigation IN2 may be disposed at the edge of the first region DR1 in line with the second pressure sensitive cell CE2. A third icon navigation IN3 may be disposed at the edge of the first region DR1 in line with the third pressure sensitive cell CE3. A fourth icon navigation IN4 may be disposed at the edge of the first region DR1 in line with the fourth pressure sensitive cell CE4. Thus, the user can easily find the position of each of the first to fourth pressure sensitive cells CE1, CE2, CE3, and CE4 on the side surface and the lower surface or the position of each of the icons corresponding to the first to fourth pressure sensitive cells CE1, CE2, CE3, and CE4, respectively, by virtue of the first to fourth icon navigations IN1, IN2, IN3, and IN4.

Referring to FIG. 31, the positions of the icon navigation INa, INb, Inc, and INd according to an exemplary embodiment of the present invention will be described. The icon navigations INa, INb, INc, and INd may be indicated at the positions that a user can see when she/he watches the display device 10_1 from the front. That is to say, the icon navigations INa, INb, Inc, and INd may be indicated at the edge of the first region DR1 of the display device 10_1 and in the area adjacent to the edge of the first region DR1. For example, the display device 10_1 may include an icon navigation INa disposed at the edge of the first region DR1, an icon navigation INb disposed at the end of the second region DR2 adjacent to the first region DR1, an icon navigation INc disposed from the first region DR1 to the second region DR2, and an icon navigation INd disposed at the corner of the first region DR1. It is, however, to be understood that this is merely illustrative.

The icon navigation INa disposed at the edge of the first region DR1 may be located in line with a first sensing area CA1 and may indicate the position of the pressure sensitive cell in the first sensing area CA1 or the position of the indicated icon corresponding to the pressure sensitive cell in the first sensing area CA1. The icon navigation INb disposed at the end of the second region DR2 adjacent to the first region DR1 may be located in line with a second sensing area CA2 and may indicate the position of the pressure sensitive cell in the second sensing area CA2 or the position of the indicated icon corresponding to the pressure sensitive cell. The icon navigation INd disposed at the corner of the first region DR1 may be located in line with a third sensing area CA3 and may indicate the position of the pressure sensitive cell in the third sensing area CA3 or the position of the indicated icon corresponding to the pressure sensitive cell. The icon navigations INa, INb, Inc, and INd may have the same width as the sensing areas CA1, CA2, CA3 and CA4, respectively. It is, however, to be understood that is the inventive concepts are not limited thereto. The widths of the icon navigations INa, INb, Inc, and INd may be smaller or larger than the widths of the sensing areas CA1, CA2, CA3, and CA4, respectively. Although the icon navigations INa, INb, Inc, and INd are shown as a bar shape in FIG. 31, this is merely illustrative. The icon navigations INa, INb, Inc, and INd may have any of a variety of shapes as long as a user can recognize the positions of the pressure sensitive cells. To allow a user to get immersed into images displayed on the display device 10_1, the icon navigations INa, INb, Inc, and INd may be indicated only when the user touches the edge of the first region DR1 of the display device 10_1 and may disappear when the user touches it again.

According to exemplary embodiments of the present invention, images can be displayed even on the side surfaces or the lower surface so that the display area of the display device can be expanded. In addition, pressure sensors are disposed on the side surfaces or the lower surface of the display device, so that the sensors can be used on behalf of physical buttons such as volume control buttons, a power button, a call button, a camera button, an Internet button, and a squeezing button.

Although certain exemplary embodiments have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising a display surface:
the display surface including a first display surface disposed on a first plane and a second display surface disposed on a second plane crossing the first plane, wherein:
the second display surface is connected to the first display surface;
an area of the first display surface is larger than an area of the second display surface; and
the second display surface includes at least one icon portion in which an icon is configured to be displayed.

2. A The display device of claim 1, wherein the second display surface further includes at least one sensing area.

3. A The display device of claim 2, wherein the at least one icon portion overlaps with the at least one sensing area.

4. A The display device of claim 3, wherein the at least one icon portion includes a plurality of icon portions, the plurality of icon portions being spaced apart from each other.

5. A The display device of claim 4, wherein the at least one sensing area includes a plurality of sensing areas, each of the plurality of icon portion corresponding to each of the plurality of sensing area.

6. A The display device of claim 3, wherein the at least one sensing area is configured to sense a touch input.

7. A The display device of claim 3, wherein the at least one sensing area is configured to sense a pressing input.

8. A The display device of claim 1, wherein the display surface further comprises at least one icon navigation portion in which an icon navigation is configured to be displayed.

9. A The display device of claim 8, wherein the at least one icon navigation portion is located in the first display surface.

10. A The display device of claim 9, wherein the at least one icon navigation portion is configured to indicate a position of the at least one icon portion.

11. A The display device of claim 10, wherein the at least one icon navigation portion is positioned adjacent to an edge of the first display surface.

12. A The display device of claim 10, wherein the at least one icon navigation portion is located in line with the at least one icon portion.

13. A The display device of claim 8, wherein the icon navigation is displayed in the at least one icon navigation when an edge of the first display surface is touched.

14. A The display device of claim 13, wherein the icon navigation disappears in the at least one icon navigation when the edge of the first display surface is further touched during the icon navigation being displayed.

15. A display device comprising:
a display unit comprising an upper surface and a first side surface connected to the upper surface; and
a sensor unit disposed on the display unit, wherein:
the upper surface and the first side surface are used as a display area;
the first side surface is configured to display an icon; and
the sensor unit is configured to sense a touch or a press on the icon.

16. A The display device of claim 15, wherein the display unit further comprises a second side surface connected to the upper surface and the first side surface, the second side surface being configured to display an icon.

17. A The display device of claim 15, wherein the upper surface is a main display surface of the display device.

18. A The display device of claim 15, wherein the upper surface comprises at least one icon navigation portion in which an icon navigation is configured to be displayed.

19. A The display device of claim 18, wherein the at least one icon navigation portion is configured to indicate a position of the icon.

20. A The display device of claim 19, wherein the at least one icon navigation portion is positioned adjacent to an edge of the upper surface adjacent the first side surface.

* * * * *